(12) United States Patent
Nazm Bojnordi et al.

(10) Patent No.: US 9,256,369 B2
(45) Date of Patent: Feb. 9, 2016

(54) PROGRAMMABLE MEMORY CONTROLLER

(71) Applicants: SAMSUNG ELECTRONICS CO., LTD., Suwon, Gyeonggi-Do (KR); University of Rochester, Rochester, NY (US)

(72) Inventors: Mahdi Nazm Bojnordi, Rochester, NY (US); Engin Ipek, Rochester, NY (US); Arun S. Jagatheesan, Cupertino, CA (US)

(73) Assignees: Samsung Electronics Co., Ltd., Suwon-si (KR); University of Rochester, Rochester, NY (US)

( * ) Notice: Subject to any disclaimer, the term of this patent is extended or adjusted under 35 U.S.C. 154(b) by 347 days.

(21) Appl. No.: 13/865,959

(22) Filed: Apr. 18, 2013

(65) Prior Publication Data

US 2013/0282972 A1 Oct. 24, 2013

Related U.S. Application Data

(60) Provisional application No. 61/635,227, filed on Apr. 18, 2012.

(51) Int. Cl.
*G06F 13/14* (2006.01)
*G06F 3/06* (2006.01)
*G11C 7/10* (2006.01)
*G06F 13/16* (2006.01)

(52) U.S. Cl.
CPC .............. *G06F 3/0611* (2013.01); *G06F 13/16* (2013.01); *G11C 7/1072* (2013.01)

(58) Field of Classification Search
CPC ...... G11C 7/1072; G06F 3/0611; G06F 13/16
USPC ........................................... 711/105
See application file for complete search history.

(56) References Cited

U.S. PATENT DOCUMENTS 8,407,446 B2 * 3/2013 Forrer et al. ................. 711/171
2014/0108773 A1 4/2014 Jagatheesan et al.

OTHER PUBLICATIONS

Shye, A. et al., "Into the Wild: Studying Real User Activity Patterns to Guide Power Optimizations for Mobile Architectures", Proceedings of the 42nd Annual IEEE/ACM International Symposium on Microarchitecture (MICRO-42), Dec. 12-16, 2009, pp. 168-178, IEEE, United States.
Isci, C. et al., "An Analysis of Efficient Multi-Core Global Power Management Policies; Maximizing Performance for a Given Power Budget", Proceedings of the 39th Annual IEEE/ACM International Symposium on Microarchitecture (MICRO-39), Dec. 2006, p. 347-358, IEEE, United States.
Jacob, B. et al., "Memory Systems: Cache, DRAM, Disk", Morgan Kaufmann Publishers, 2008, pp. 1-1017, Elseiver, United States.

(Continued)

*Primary Examiner* — Jae Yu
(74) *Attorney, Agent, or Firm* — Sherman IP LLP; Kenneth L. Sherman; Steven Laut

(57) ABSTRACT

One embodiment includes a programmable memory controller. The programmable memory controller includes a request processor that comprises a first domain-specific instruction set architecture (ISA) for accelerating common requests. A transaction processor comprises a second domain-specific ISA for accelerating transaction processing tasks. A dedicated command logic module inspects each memory command to a memory device and stalls particular commands for meeting timing constraints for application specific control of the memory device.

30 Claims, 18 Drawing Sheets

(56) References Cited

OTHER PUBLICATIONS

Hur, I. et al., "A Comprehensive Approach to DRAM Power Management", Proceedings of the IEEE 14th International Symposium on High Performance Compute Architecture (HPCA 2008), Feb. 16-20, 2008, pp. 305-316, IEEE, United States.

Ipek, E. et al., "Self-Optimizing Memory Controllers: A Reinforcement Learning Approach", Proceedings of the International Symposium on Computer Architecture (ISCA), Jun. 2008, pp. 1-12, Beijing, China.

Isen, C. et al., "ESKIMO—Energy Savings using Semantic Knowledge of Inconsequential Memory Occupancy for DRAM subsystem", Proceedings of the 42nd Annual IEEE/ACM International Symposium on Microarchitecture (MICRO 42), Dec. 12, 2009, pp. 337-346, ACM, United States.

Kim, Y. et al., "Thread Cluster Memory Scheduling: Exploiting Differences in Memory Access Behavior", Proceedings of the 43rd Annual IEEE/ACM International Symposium on Microarchitecture (MICRO), Dec. 4-8, 2010, pp. 65-76, IEEE, United States.

Mutlu, O. et al., "Parallelism-Aware Batch Scheduling: Enhancing both Performance and Fairness of Shared DRAM Systems", Proceedings of the 35th Annual International Symposium on Computer Architecture (ISCA'08), Jun. 21, 2008, pp. 63-74, IEEE, United States.

Rixner, S. et al., "Memory Access Scheduling", Proceedings of the 27th Annual International Symposium on Computer Architecture (ISCA'00), Jun. 10, 2000, pp. 128-138, ACM, United States.

Lee, K-B., et al., "An Efficient Quality-Aware Memory Controller for Multimedia Platform SoC", Proceedings of the IEEE Transactions on Circuits and Systems for Video Technology, May 2005, pp. 620-633, vol. 15, Issue 5, IEEE, United States.

Martin, J. et al., "A Microprogrammable Memory Controller for High-Performance Dataflow Applications", Proceedings of the ESSCIRC 2009, Sep. 14-18, 2009, pp. 348-351, IEEE, United States.

Liu, S. et al., "Flikker: Saving DRAM Refresh-power through Critical Data Partitioning", Proceedings of the 16th International Conference on Architectural Support for Programming Languages and Operating Systems (ASPLOS XVI), Mar. 5, 2011, pp. 213-224, ACM, United States.

Stuecheli, J. et al., "Elastic Refresh: Techniques to Mitigate Refresh Penalties in High Density Memory", Proceedings of the 43rd Annual IEEE/ACM International Symposium on Microarchitecture (MICRO'10), Dec. 4-8, 2010, p. 375-384, IEEE, United States.

Zhang, Z. et al., "A Permutation-based Page Interleaving Scheme to Reduce Row-buffer Conflicts and Exploit Data Locality", Proceedings of the 33rd Annual IEEE/ACM International Symposium on Microarchitecture (MICRO-33), Dec. 10-13, 2000, pp. 32-41, IEEE, United Sates.

Zheng, H. et al., "Mini-Rank: Adaptive DRAM Architecture for Improving Memory Power Efficiency", Proceedings of the 41st IEEE/ACM International Symposium on Microarchitecture (MICRO-41), Nov. 8-12, 2008, pp. 210-221, IEEE, United States.

Sherwood, T. et al., "Phase Tracking and Prediction", Proceedings of the 30th International Symposium on Computer Architecture (ISCA'03), Jun. 9, 2003, pp. 336-349, ACM, United States.

Bojnordi, M.N. et al., "PARDIS: A Programmable Memory Controller for the DDRx Interfacing Standards", Proceedings of the 39th Annual International Symposium on Computer Architecture (ISCA'12), Jun. 9-13, 2012, pp. 13-24, IEEE, United States.

Liu, F. et al., "Understanding How Off-Chip Memory Bandwidth Partitioning in Chip Multiprocessors Affects System Performance", Proceedings of the 16th International Symposium on High Performance Computer Architecture (HPCA'10), Jan. 9-14, 2010, pp. 1-12, IEEE, United States.

Falaki, H. et al., "Diversity in Smartphone Usage", Proceedings of the 8th International Conference on Mobile Systems, Applications, and Services (MobiSys'10), Jun. 15, 2010, pp. 179-194, ACM, United States.

Anonymous, "SPEC CPU 2006", Jun. 10, 2014, pp. 1-3, Standard Performance Evaluation Corporation, United States [downloaded from http://www.spec.org/cpu2006/ on Jun. 9, 2015].

Anonymous, "SIMICS Wind River Simics Full System Simulator" Jun. 2, 2010, pp. 1-11, Wind River, United States [downloaded from http://www.windriver.com/products/simics/ on Jun. 9, 2015].

Bienia, C. et al., "The PARSEC Benchmark Suite: Characterization and Architectural Implications", Princeton University Technical Report (TR-811-08), Jan. 2008, pp. 1-28, Princeton University, United States.

Chatterjee, N. et al., "USIMM: the Utah Simulated Memory Module", A Simulation Infrastructure for the JWAC Memory Scheduling Championship, Feb. 20, 2012, pp. 1-24,University of Utah and Intel Corporation, United States.

Albayraktaroglu, K. et al., "BioBench: A Benchmark Suite of Bioinformatics Applications", Proceedings of the IEEE International Symposium on Performance Analysis of Systems and Software (ISPASS'05), Mar. 20, 2005, pp. 1-8, IEEE, United States.

Osier, J., "GNU gprof", Jan. 1993, pp. 1-11, Free Software Foundation, Inc., United States [downloaded from https://web.archive.org/web/20000818063518/http://www.cs.utah.edu/dept/old/texinfo/as/gprof.html on Jun. 9, 2015].

Samsung Electronics Co. Ltd., "Samsung Apps", Sep. 17, 2010, pp. 1-2 [http://www.samsung.com/us/appstore, downloaded from Internet Archive Wayback Machine on Jun. 9, 2015].

* cited by examiner

800

900

```
# FR-FCFS Scheduling Algorithm

# Initialization
    LD    R10, R0(0)   # load the key for ready read/write
    LD    R11, R0(1)   # load the key mask for ready read/write
    LD    R12, R0(2)   # load the key for ready activate
    LD    R13, R0(3)   # load the key mask for ready activate
    LD    R14, R0(4)   # load the mask for ready precharge
    LD    R15, R0(5)   # load the key mask for ready precharge

# Main loop
st: BTQE                      # A: wait if TQ is empty
    LTQ-C R1, R0, R10     st. # B: issue a ready CAS
    BMSK  R1, valid,     st.  #    goto next transaction
    LTQ-C R1, R0, R12     st. # C: issue a ready ACT
    BMSK  R1, valid,     st.  #    goto next transaction
    LTQ-C R1, R0, R14         # D: issue a ready PRE
    JMP   st                  #    goto next transaction
```

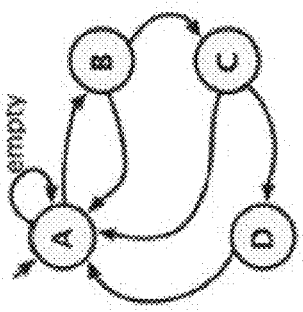

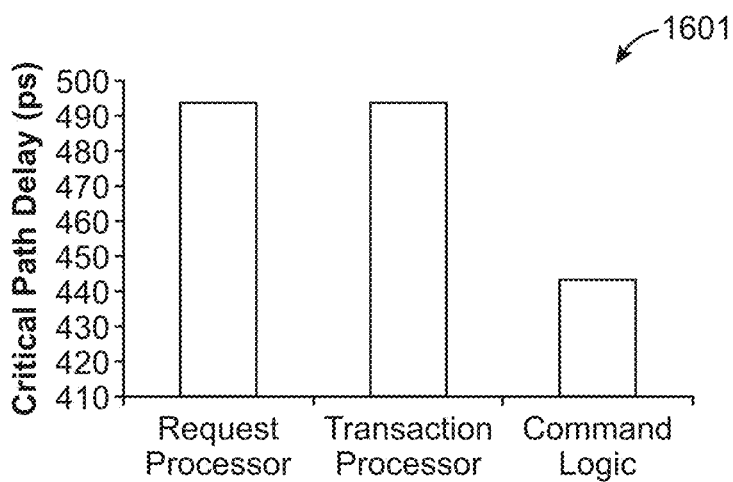
FIG. 16A
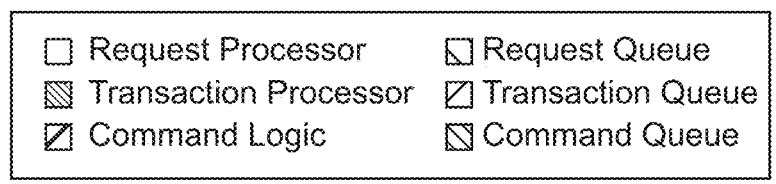
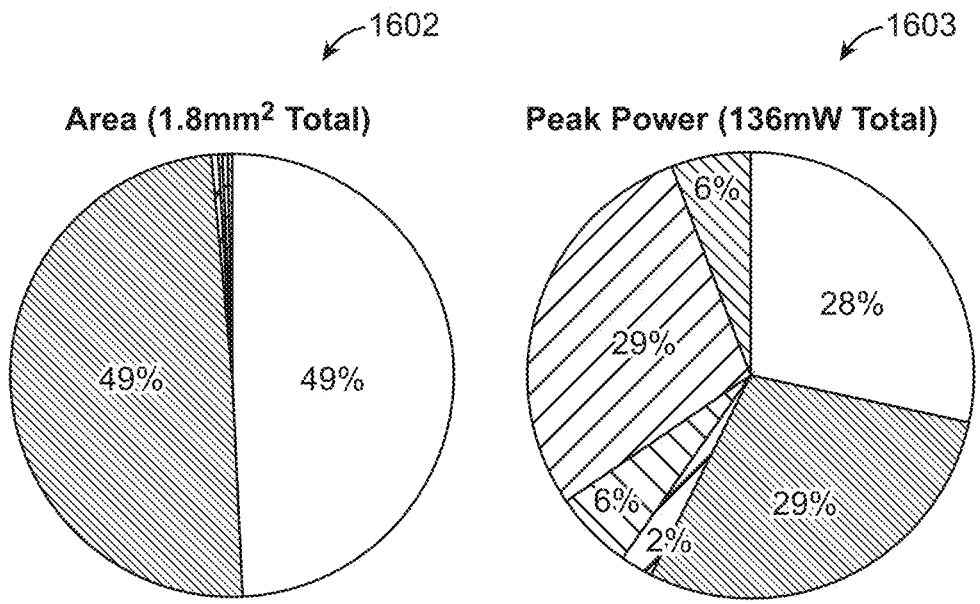
FIG. 16B
FIG. 16C

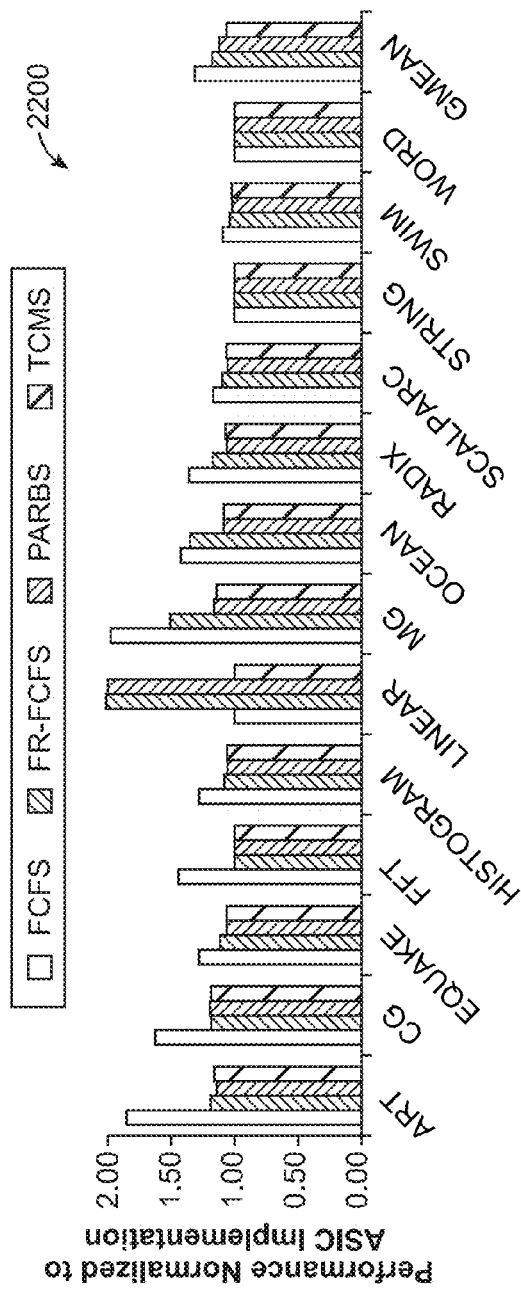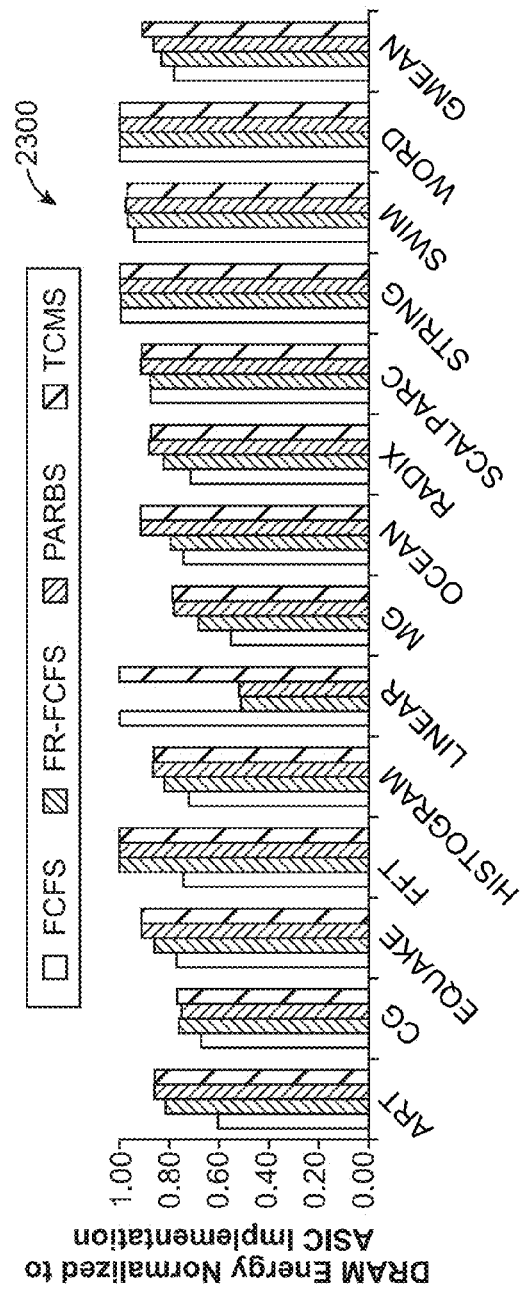

ial Patent Application Ser. No. 61/635,227, filed Apr. 18, 2012, incorporated herein by reference in its entirety.

PROGRAMMABLE MEMORY CONTROLLER

CROSS-REFERENCE TO RELATED APPLICATIONS

This application claims the priority benefit of U.S. Provisional Patent Application Ser. No. 61/635,227, filed Apr. 18, 2012, incorporated herein by reference in its entirety.

TECHNICAL FIELD

One or more embodiments relate generally to memory controllers and, in particular, to a programmable memory controller for application specific control of a memory device.

BACKGROUND

Administrators in data centers and device manufacturers usually use a single configuration for storage systems. The single configuration of hardware for a storage system may not be optimal for all of the operations performed by the software used. Different software may have different memory usage requirements.

SUMMARY

In one embodiment, a programmable memory controller includes a request processor that comprises a first domain-specific instruction set architecture (ISA) for accelerating common requests. In one embodiment, a transaction processor comprises a second domain-specific ISA for accelerating transaction processing tasks. In one embodiment, a dedicated command logic module inspects each memory command to a memory device and stalls particular commands for meeting timing constraints for application specific control of the memory device.

Another embodiment provides a system that comprises one or more system processors, a programmable memory controller coupled to the one or more system processors, and a memory device coupled to the programmable memory controller. In one embodiment, the programmable memory controller comprises: a programmable request processor that uses a first domain-specific instruction set architecture (ISA) for accelerating common requests. In one embodiment, the programmable memory controller further comprises a programmable transaction processor that uses a second domain-specific ISA for accelerating transaction processing tasks. In one embodiment, a dedicated command logic module inspects each memory command to the memory device and stalls particular commands for meeting timing constraints for application specific control of the memory device.

One embodiment provides a non-transitory computer-readable medium having instructions which when executed on a computer perform a method comprising: processing memory requests using a first domain-specific instruction set architecture (ISA) for accelerating memory requests. In one embodiment, the method further comprises processing transactions using a second domain-specific ISA for accelerating transaction processing tasks. In one embodiment, each memory command directed to a memory device is inspected, and particular commands are stalled for meeting timing constraints for application specific control of the memory device.

These and other aspects and advantages of the embodiments will become apparent from the following detailed description, which, when taken in conjunction with the drawings, illustrate by way of example the principles of the embodiments.

BRIEF DESCRIPTION OF THE DRAWINGS

For a fuller understanding of the nature and advantages of the embodiments, as well as a preferred mode of use, reference should be made to the following detailed description read in conjunction with the accompanying drawings, in which:

FIG. 11 shows an example transaction processing code for first-ready (FR)-FCFS scheduling, according to an embodiment.

FIG. 16A shows a delay comparison for an example implementation of a programmable memory controller and ASIC implementations, according to an embodiment.

FIG. 16B shows a physical area comparison for an example implementation of a programmable memory controller and ASIC implementations, according to an embodiment.

FIG. 16C shows a peak power comparison for an example implementation of a programmable memory controller and ASIC implementations, according to an embodiment.

FIG. 22 shows a speedup comparison for an example implementation of a programmable memory controller over ASIC implementations and TCMS scheduling algorithms using application-specific mapping on PARDIS, according to an embodiment.

FIG. 23 shows DRAM energy savings comparison for an example implementation of a programmable memory controller over ASIC implementations and TCMS scheduling algorithms using application-specific mapping on PARDIS, according to an embodiment.

DETAILED DESCRIPTION

The following description is made for the purpose of illustrating the general principles of the embodiments and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

One or more embodiments relate generally to programmable memory controllers. One embodiment provides a programmable memory controller that includes a request processor that comprises a first domain-specific instruction set architecture (ISA) for accelerating common requests. In one embodiment, a transaction processor comprises a second domain-specific ISA for accelerating transaction processing tasks. In one embodiment, a dedicated command logic module inspects each memory command to a memory device and stalls particular commands for meeting timing constraints for application specific control of the memory device. In one embodiment, the programmable memory controller may be deployed in a datacenter for use, for example, with servers. In other embodiments, the programmable memory controller may be deployed for use in electronic devices, such as televisions, computers, tablets, cellular telephones, cameras, a personal digital assistant (PDA), wearable computing devices, wearable communication devices, etc. In one or more embodiments, the memory may be customized for a specific electronic device using an embodiment of a programmable memory controller. In one or more embodiments, the programmable memory controller may be reprogrammed dynamically based on application access patterns.

In one embodiment, the electronic devices comprise one or more mobile electronic devices capable of data communication over a communication link such as a wireless communication link. Examples of such mobile device include a mobile phone device, a mobile tablet device, wearable devices, etc.

Figure 1:
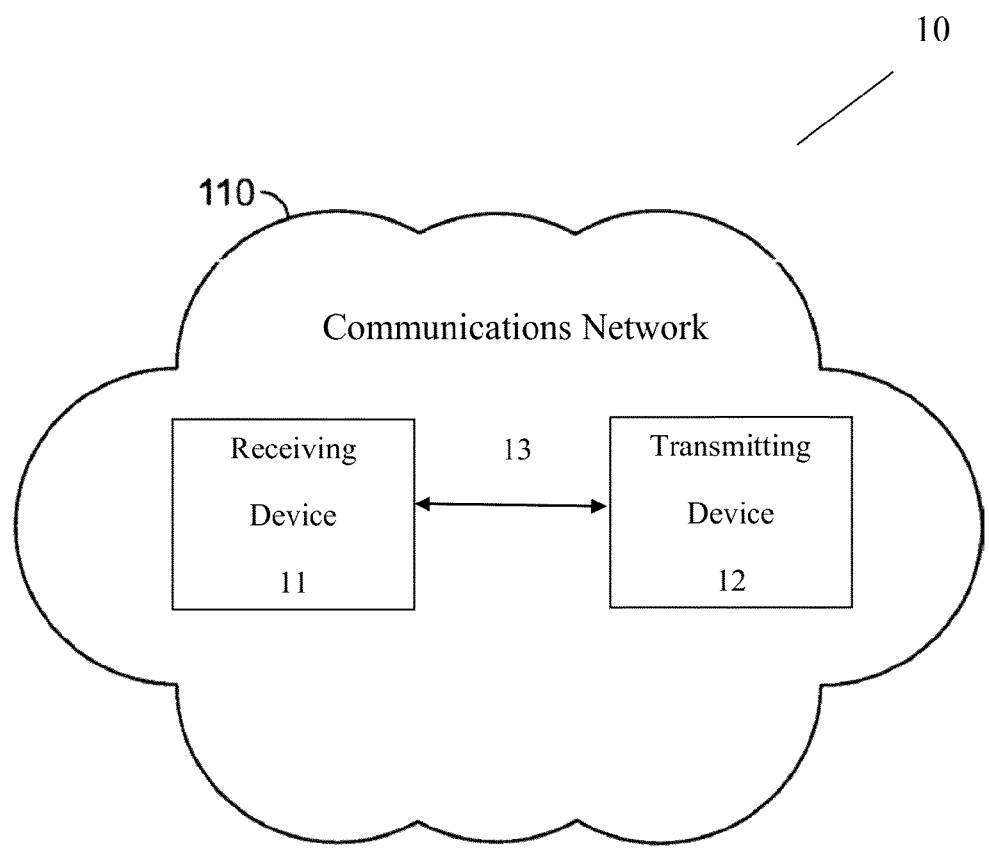
FIG. 1 shows a schematic view of a communications system, according to an embodiment.

FIG. 1 is a schematic view of a communications system in accordance with one embodiment. Communications system 10 may include a communications device that initiates an outgoing communications operation (transmitting device 12) and communications network 110, which transmitting device 12 may use to initiate and conduct communications operations with other communications devices within communications network 110. For example, communications system 10 may include a communication device that receives the communications operation from the transmitting device 12 (receiving device 11). Although communications system 10 may include several transmitting devices 12 and receiving devices 11, only one of each is shown in FIG. 1 to simplify the drawing.

Any suitable circuitry, device, system or combination of these (e.g., a wireless communications infrastructure including communications towers and telecommunications servers) operative to create a communications network may be used to create communications network 110. Communications network 110 may be capable of providing communications using any suitable communications protocol. In some embodiments, communications network 110 may support, for example, traditional telephone lines, cable television, Wi-Fi (e.g., a 802.11 protocol), Bluetooth®, high frequency systems (e.g., 900 MHz, 2.4 GHz, and 5.6 GHz communication systems), infrared, other relatively localized wireless communication protocol, or any combination thereof. In some embodiments, communications network 110 may support protocols used by wireless and cellular phones and personal email devices (e.g., a Blackberry®). Such protocols can include, for example, GSM, GSM plus EDGE, CDMA, quad-band, and other cellular protocols. In another example, a long range communications protocol can include Wi-Fi and protocols for placing or receiving calls using VOIP or LAN. Transmitting device 12 and receiving device 11, when located within communications network 110, may communicate over a bidirectional communication path such as path 13. Both transmitting device 12 and receiving device 11 may be capable of initiating a communications operation and receiving an initiated communications operation.

Transmitting device 12 and receiving device 11 may include any suitable device for sending and receiving communications operations. For example, transmitting device 12 and receiving device 11 may include a media player, a cellular telephone or a landline telephone, a personal e-mail or messaging device with audio and/or video capabilities, pocket-sized personal computers, PDAs, a desktop computer, a laptop computer, a datacenter computer, a server, a wearable electronic device, and any other device capable of communicating wirelessly (with or without the aid of a wireless enabling accessory system) or via wired pathways (e.g., using traditional telephone wires). The communications operations may include any suitable form of communications, including for example, voice communications (e.g., telephone calls), data communications (e.g., e-mails, text messages, media messages), or combinations of these (e.g., video conferences).

Figure 2:
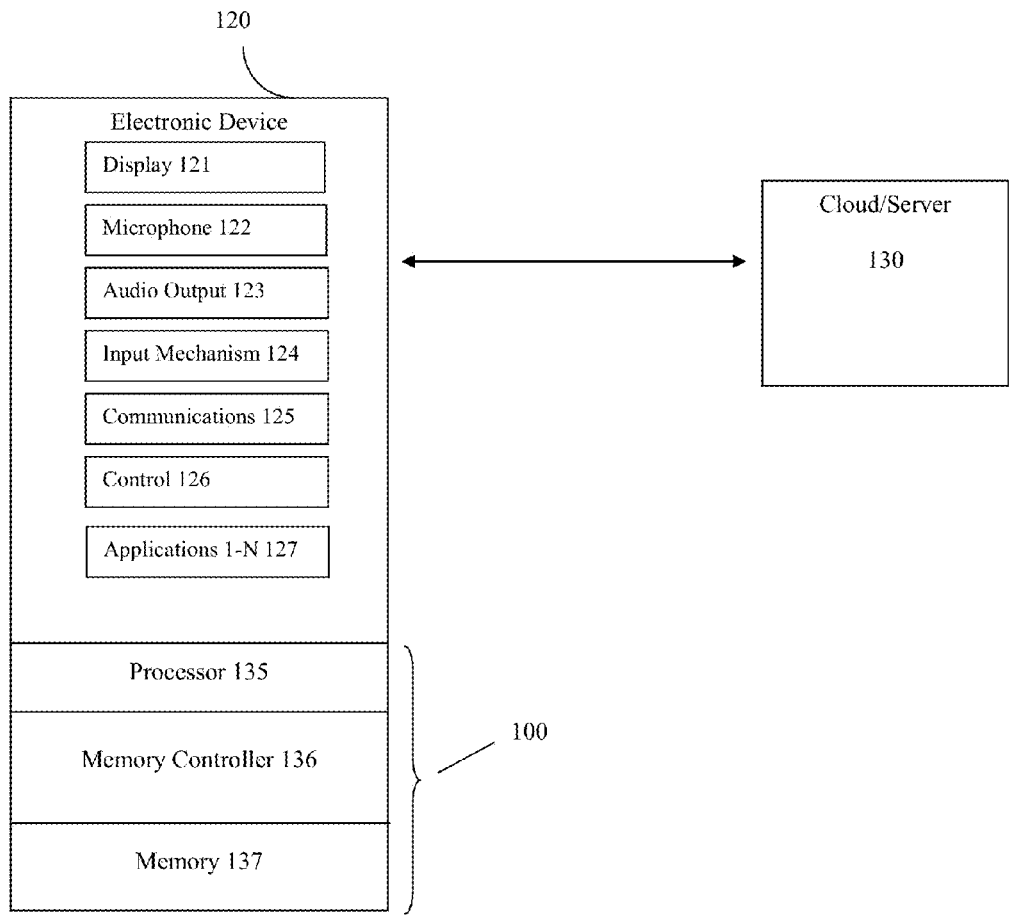
FIG. 2 shows a block diagram of an architecture system for employing a programmable memory controller, according to an embodiment.

FIG. 2 shows a functional block diagram of an embodiment of an architecture system 100 employing a process 135, a programmable memory controller 136 and a memory module 137, according to an embodiment. In one embodiment, the processor module 135 includes one or more processing devices. In one embodiment, the memory module 137 comprises one or more DRAM devices, or other memory devices).

In one embodiment, the system 100 may be employed by an electronic device 120 that may communicate with a cloud or server device 130. In one embodiment, the electronic device comprises the system 100, a display 121, and one or more applications that may execute on the electronic device 120, such as application 1-N 127, N being a positive integer.

In one embodiment, display 121 may be a separate device from the electronic device 120 or integrated with the electronic device 120.

In one embodiment, both transmitting device 12 and receiving device 11 may include some or all of the features of the electronic device 120. In one embodiment, the electronic device 120 may comprise a microphone 122, audio output 123, input mechanism 124, communications circuitry 125, control circuitry 126, a camera, a global positioning system (GPS) receiver module, and any other suitable components.

In one embodiment, all of the applications employed by display 121, input mechanism 124, the audio output and communications circuitry 123 may be interconnected and managed by control circuitry 126.

In one embodiment, the audio output may include any suitable audio component for providing audio to a user of the electronics device 120. For example, the audio output may include one or more speakers (e.g., mono or stereo speakers) built into an electronics device 120. In some embodiments, the audio output may include an audio component that is remotely coupled to an electronics device 120. For example, the audio output may include a headset, headphones or earbuds that may be coupled to communications device with a wire (e.g., coupled to an electronics device 1-N 150 with a jack) or wirelessly (e.g., Bluetooth® headphones or a Bluetooth® headset).

In one embodiment, display 121 may include any suitable screen or projection system for providing a display visible to the user. For example, display 121 may include a screen (e.g., an LCD screen) that is incorporated in an electronics device 120. As another example, display 121 may include a movable display or a projecting system for providing a display of content on a surface remote from an electronics device 120 (e.g., a video projector). Display 121 may be operative to display content (e.g., information regarding communications operations or information regarding available media selections) under the direction of control circuitry 126.

In one embodiment, input mechanism 124 may be any suitable mechanism or user interface for providing user inputs or instructions to an electronics device 120. Input mechanism 124 may take a variety of forms, such as a button, keypad, dial, a click wheel, or a touch screen. The input mechanism 124 may include a multi-touch screen. The input mechanism may include a user interface that may emulate a rotary phone or a multi-button keypad, which may be implemented on a touch screen or the combination of a click wheel or other user input device and a screen.

In one embodiment, communications circuitry 125 may be any suitable communications circuitry operative to connect to a communications network (e.g., communications network 110, FIG. 1) and to transmit communications operations and media from an electronics device 120 to other devices within the communications network. Communications circuitry 125 may be operative to interface with the communications network using any suitable communications protocol such as, for example, Wi-Fi (e.g., a 802.11 protocol), Bluetooth®, high frequency systems (e.g., 900 MHz, 2.4 GHz, and 5.6 GHz communication systems), infrared, GSM, GSM plus EDGE, CDMA, quadband, and other cellular protocols, VOIP, or any other suitable protocol.

In some embodiments, communications circuitry 125 may be operative to create a communications network using any suitable communications protocol. For example, communications circuitry 125 may create a short-range communications network using a short-range communications protocol to connect to other communications devices. For example, communications circuitry 125 may be operative to create a local communications network using the Bluetooth® protocol to couple an electronics device 120 with a Bluetooth® headset.

In one embodiment, control circuitry 126 may be operative to control the operations and performance of an electronics device 120. Control circuitry 126 may include, for example, a processor, a bus (e.g., for sending instructions to the other components of an electronics device 120), memory 137, storage, or any other suitable component for controlling the operations of an electronics device 120. In some embodiments, the processor module 135 may drive the display and process inputs received from the user interface. The memory 137 and storage may include, for example, DRAM, cache, Flash memory, ROM, and/or other RAM. In some embodiments, the memory 137 may be specifically dedicated to storing firmware (e.g., for device applications such as an operating system, user interface functions, and processor functions). In some embodiments, the memory 137 may be operative to store information related to other devices with which an electronics device 120 performs communications operations (e.g., saving contact information related to communications operations or storing information related to different media types and media items selected by the user).

In one embodiment, the control circuitry 126 may be operative to perform the operations of one or more applications 1-N 127 implemented on an electronics device 120. Any suitable number or type of applications may be implemented. Although the following discussion will enumerate different applications, it will be understood that some or all of the applications may be combined into one or more applications. For example, an electronics device 120 may include a voice recognition application, a dialog application, a map application, a media application (e.g., QuickTime, MobileMusic.app, or MobileVideo.app), etc. In some embodiments, an electronics device 120 may include one or several applications operative to perform communications operations. For example, an electronics device 120 may include a messaging application, a mail application, a chat application, a telephone application, a voicemail application, an instant messaging application (e.g., for chatting), a videoconferencing application, a fax application, or any other suitable application for performing any suitable communications operation.

In some embodiments, an electronics device 120 may include a microphone 122. For example, an electronics device 120 may include the microphone 122 to allow the user to transmit audio (e.g., voice audio) during a communications operation or as a means of establishing a communications operation or as an alternate to using a physical user interface. The microphone 122 may be incorporated in an electronics device 120, or may be remotely coupled to an electronics device 120. For example, a microphone 122 may be incorporated in wired headphones, or a microphone may be incorporated in a wireless headset.

In one embodiment, an electronics device 120 may include any other component suitable for performing a communications operation. For example, an electronics device 120 may include a power supply, ports or interfaces for coupling to a host device, a secondary input mechanism (e.g., an ON/OFF switch), or any other suitable component.

In one embodiment, a user may direct an electronics device 120 to perform a communications operation using any suitable approach. As one example, a user may receive a communications request from another device (e.g., an incoming telephone call, an email or text message, an instant message), and may initiate a communications operation by accepting the communications request. As another example, the user may initiate a communications operation by identifying another communications device and transmitting a request to initiate a communications operation (e.g., dialing a telephone number, sending an email, typing a text message, or selecting a chat screen name and sending a chat request).

In one embodiment, an electronic device 120 may comprise a mobile device that may utilize mobile device hardware functionality including: a GPS receiver module, a camera module, a compass module, and an accelerometer and gyroscope module. The GPS receiver module may be used to identify a current location of the mobile device (i.e., user). The compass module is used to identify direction of the mobile device. The accelerometer and gyroscope module is used to identify tilt of the mobile device.

In one embodiment, the system 100 provides the electronic devices 120 the ability to provide application specific memory controlling for optimizing performance and energy saving. In one embodiment, the programmable memory controller 136 uses domain-specific instruction set architectures (ISAs) and implementation of the programmable memory controller 136 that may meet the performance requirements of a high-speed DDRx interface.

In one embodiment, the programmable memory controller 136 partitions the job of deriving a high-performance command schedule between a pair of programmable request and transaction processors with domain-specific ISAs, while enforcing the timing correctness of the derived schedule in dedicated command logic. In one embodiment, the separation between timing correctness and performance optimization allows request and transaction processor resources to be dedicated exclusively to deriving a high-performance schedule, without the burden of any extra cycles to verify the correctness of the derived schedule.

Figure 3:
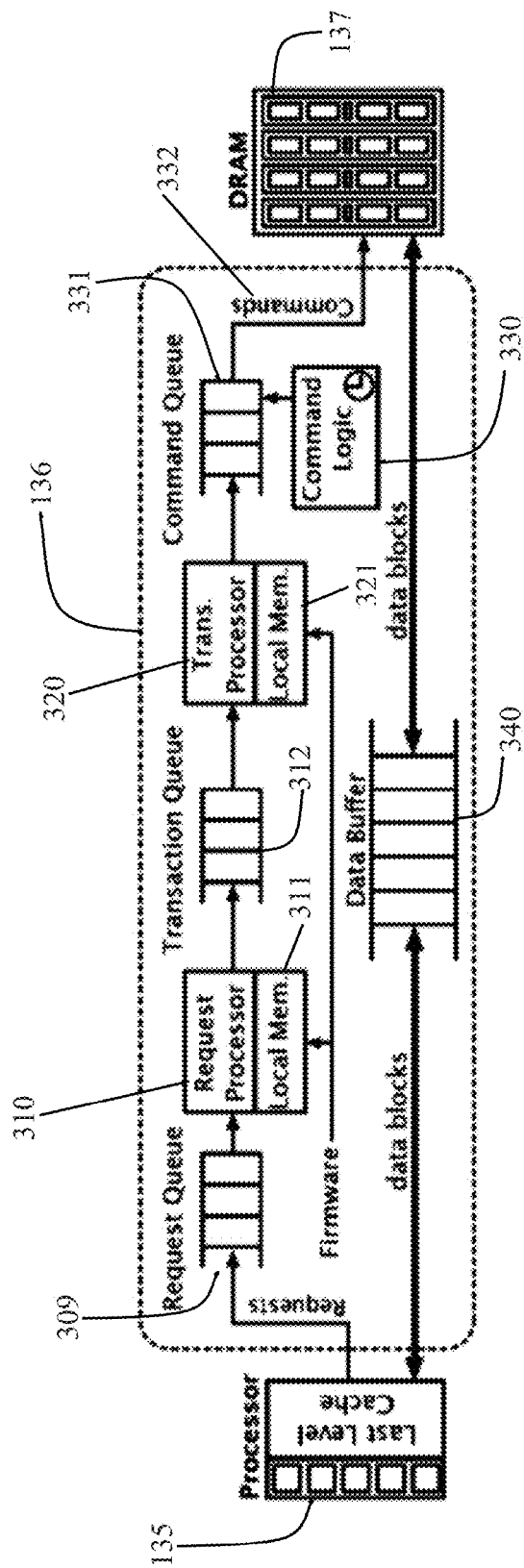
FIG. 3 shows an example architecture configuration for a programmable memory controller, according to an embodiment.

FIG. 3. Shows an architecture of the programmable memory controller 136 according to one embodiment. One or more embodiments employ the programmable memory controller 136 architecture for the DDRx interfacing standards (PARDIS), an architecture that provides sufficiently high-performance to make the firmware implementation of DRAM control policies practical. One or more embodiments divides the tasks associated with high-performance DRAM control among a programmable request processor 310, a programmable transaction processor 320, and dedicated command logic 330. The request processor 310 and the transaction processor 320 each have a domain-specific ISA for accelerating common request and memory transaction processing tasks, respectively. The timing correctness of the derived schedule is enforced in hardware through dedicated command logic 330, which inspects and, if necessary, stalls each DDRx command to the memory module 137 (e.g., DRAM) to ensure that all DDRx timing constraints are met. One or more embodiments provide a separation between performance optimization and timing correctness, which allows the firmware to dedicate request processor 310 and transaction processor 320 resources exclusively to optimizing throughput, performance, and quality of service (QoS), without expending limited compute cycles on verifying the correctness of the derived schedule.

In one embodiment, synthesis results on a complete resistor-transistor logic (RTL) implementation of system 100 for PARDIS indicates that the programmable memory controller 136 may occupy less than 1.8 mm$^2$ of area and consumes less than 138 mW of peak power at 22 nm. In one embodiment, results using the programmable memory controller 136 on a set of scalable parallel applications show that performance and DRAM energy within 5% of an ASIC are achieved when four command scheduling policies, an address mapping heuristic, a refresh scheduling mechanism, and a power management algorithm are implemented in firmware and mapped onto PARDIS. In one embodiment, by enabling a set of application-specific address mapping optimizations, the programmable memory controller 136 improves average performance and DRAM energy usage.

Modern DRAM systems are organized into a hierarchy of channels, ranks, banks, rows, and columns to exploit locality and request-level parallelism. Contemporary high-performance microprocessors commonly integrate two to four independent memory controllers, each with a dedicated DDRx channel. Each channel consists of multiple ranks that can be accessed in parallel, and each rank comprises multiple banks organized as rows/columns, sharing common data and address buses. A set of timing constraints dictate the minimum delay between each pair of commands issued to the memory system; maintaining high throughput and low latency necessitates a sophisticated memory controller that can correctly schedule requests around these timing constraints.

A typical DDRx memory controller receives a request stream consisting of reads and writes from the cache subsystem, and generates a corresponding DRAM command stream. Every read or write request requires accessing multiple columns of a row within the DRAM system. A row needs to be loaded into a row buffer by an activate command prior to a column access. Consecutive accesses to the same row, called row hits, enjoy the lowest access latency; however, a row miss necessitates issuing a precharge command to precharge the bitlines within the memory array, and then loading a new row to the row buffer using an activate command.

One or more embodiments use the programmable memory controller 136 for managing internal memory 137 (e.g., DRAM) resources. One or more embodiments employ a fully programmable framework that provides application-specific control of the memory module 137 (e.g., the DRAM subsystem). One or more embodiments include the fully programmable (DRAM) memory controller 136 that allows for managing request and command streams in software.

As shown in FIG. 3, a system 100 comprises a processor module 135 (e.g., a multicore processor), interfaced to off-chip memory module 137 (e.g., DRAM) over a channel (e.g., a DDR3 channel). In one embodiment, the programmable memory controller 136 receives read and write requests from the processor module 135 targeted to different addresses from the last-level cache controller of the processor module 135, and generates a sequence of DDR3 commands to orchestrate data movement between the processor module 135 and memory module 137. In one embodiment, the programmable memory controller 136 comprises the request processor 310, the transaction processor 320, and command logic 330, which are tightly-coupled processing elements that work in tandem to translate each memory request to a valid sequence of commands (e.g., DDR3 commands).

In one embodiment, upon arrival at the programmable memory controller 135, each request is enqueued at a first-in-first-out (FIFO) request queue 309 that interfaces to the request processor 310 and local memory 311. In one embodiment, the request processor 310 dequeues the next request at the head of the request queue, generates a set of DRAM coordinates: channel, rank, bank, row, and column IDs for the requested address, and creates a new DDRx transaction with the generated DRAM coordinates, to be enqueued in a transaction queue 312. In one embodiment, the request processor 310 represents the first level of translation from requests to memory transactions, and is primarily responsible for DRAM address mapping.

In one embodiment, the transaction processor 320 operates on the DDRx transactions that the request processor 310 enqueues in the transaction queue 312. In one embodiment, the primary job of the transaction processor 320 is to track the resource needs and timing constraints for each memory transaction, and to use this information to emit a sequence of DDRx commands 332 that achieves performance, energy, and QoS goals. The transaction processor's 320 ISA is different from the request processor's 310, and offers several important capabilities. In one embodiment, a subset of the instructions, transaction management instructions, allows the firmware to categorize memory requests based on the state of the memory 137 subsystem (e.g., requests that need a precharge), the request type (e.g., a write request), and application-specific criteria (e.g., thread IDs) to derive a high-performance, efficient command schedule. In one embodiment, a second subset of the instructions, command management instructions, allows the programmable memory controller 136 to emit either the next required command for a given transaction (e.g., an activate command to a particular row), or a new command for various memory module 137 (e.g., DRAM) management purposes (e.g., power-management or refresh scheduling). Commands that are emitted by the transaction processor 320 are placed in a FIFO command queue 331, which is in turn processed by the command logic 330. The data buffer 340 stores data to/from the processor module 135 and the memory module 137.

In one embodiment, the command logic 330 inspects the generated command stream, checking and if necessary, stalling, the command at the head of the command queue 331 to ensure all DDRx timing constraints are met, and synchronizing the issue of each command 332 with the DDRx clock. In one embodiment, the command logic 330 is not programmable through an ISA, and provides configurable control registers specifying the value of each DDRx timing constraint, thereby making it possible to interface the programmable memory controller 136 to different DDRx systems. Since the command logic 330 enforces all timing constraints and guarantees the timing correctness of the scheduled commands 332 in the command stream, it becomes possible to separate timing correctness from performance. In one embodiment, this separation allows the request processor 310 and the transaction processor 320 resources to be dedicated exclusively to deriving the highest-performing schedule, without the burden of any extra cycles to verify the timing of the derived schedule.

In one embodiment, programming the programmable memory controller 136 PARDIS architecture involves writing code for the request processor 310 and the transaction processor 320, and configuring the control registers specifying DDRx timing constraints to the command logic 330. In one embodiment, since the request processor 310 and the transaction processor 320 serve different purposes, the request processor 310 and the transaction processor 320 employ two very different domain-specific ISAs with customized instructions for request and transaction processing, respectively.

In one embodiment, the request processor 310 comprises a 16-bit reduced instruction set computer (RISC) architecture with separate instruction and data memories (e.g., a Harvard architecture). In one embodiment, the primary goals of the request processor 310 are to address mapping and translating each request to a DDRx transaction; to achieve these goals, the request processor 310 provides specialized data types, storage structures, and instructions for address manipulation.

Figure 4:
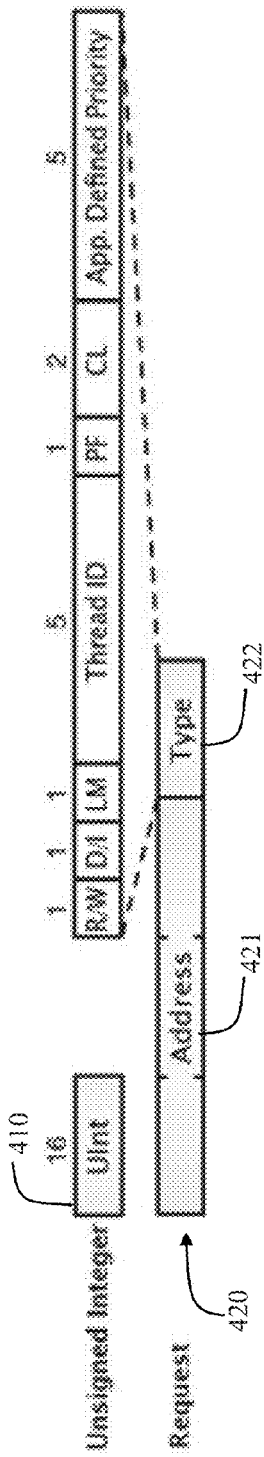
FIG. 4 shows supported data types for a request processor, according to an embodiment.

FIG. 4 shows supported data types 400 for a request processor, according to an embodiment. Request processing algorithms are dominated by arithmetic and logical operations on memory addresses and flags describing each request. In one embodiment, two data types, an unsigned integer 410 and a request 420, represent the information used in these algorithms. In one embodiment, the unsigned integer 410 is 16 bits wide, and may be used by every instruction except jumps. In one embodiment, the request 420 is 64 bits wide, comprising a 48-bit address 421 and a 16-bit metadata field 422 recording information about the DRAM request: the type of memory operation (read or write), the destination cache type (data or instruction), whether the access is initiated by a load miss, the owner thread's ID, whether the request is a prefetch, and other application specific priority flags.

In one embodiment, programmer-visible storage structures within the request processor 310 include the architectural registers, the data memory, and the request queue 309. In one embodiment, the request processor 310 provides 32 architectural registers (R0-R31); of these, one (R0) is hard-wired to zero, four (R1-R4) are dedicated to reading a 64-bit request from the request queue, and four (R5-R8) are used for temporarily storing a transaction until it is enqueued at the transaction queue 312. In one embodiment, the data memory has a linear address space with 16-bit data words, accessed by a 16-bit address.

Figure 5:
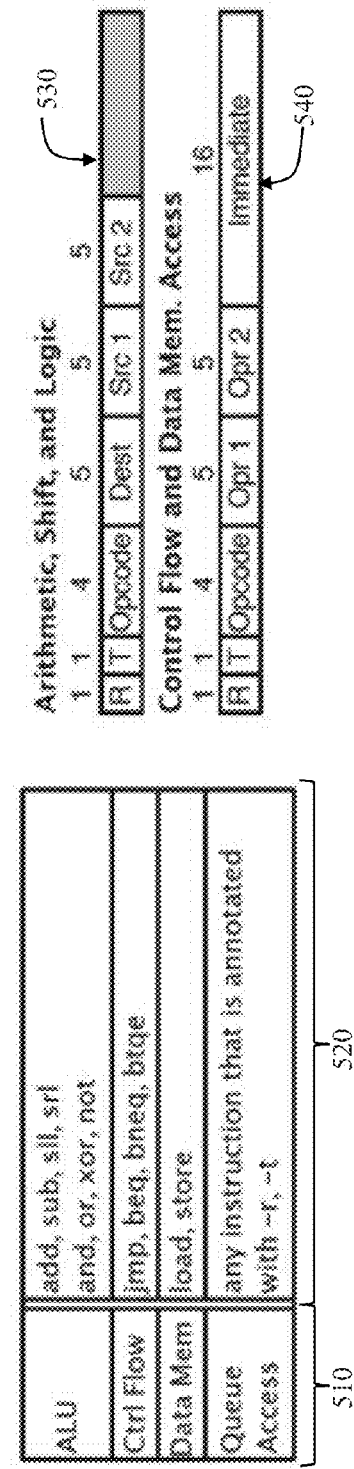
FIG. 5 shows instruction formats provided by a request processor, according to an embodiment.

FIG. 5 shows instruction formats 500 provided by a request processor 310, according to an embodiment. In one embodiment, the request processor 310 supports 14 32-bit instructions of four different types 510 with related operations 520. In one embodiment, the four different type instructions 510 comprise arithmetic and logical unit (ALU) instructions, control flow, data memory and queue access types. In one embodiment, supported ALU operations include addition, subtraction, logical shift to left and right, bitwise AND, OR, XOR, and NOT. In one embodiment, all ALU instructions may use any of the 32 architectural registers as an input operand. In one embodiment, the ALU operations use the arithmetic, shift and logic fields 530.

In one embodiment, control flow operations and data memory operations use the control flow and data memory fields 540. In one embodiment, the request processor 310 supports both jumps and branches. Possible branch conditions that may be tested are equality and inequality between two registers, and whether the transaction queue 312 is empty. In one embodiment, the target address of a branch is a 16-bit immediate value, which is an absolute address pointing to the instruction memory.

In one embodiment, similar to other RISC ISAs, the request processor 310 ISA permits only loads and stores to access the data memory. In one embodiment, for simplicity, only the displacement addressing mode (base+register) is supported, where each load and store instruction specifies a 16-bit immediate and a register specifier to form an effective address.

In one embodiment, the firmware of the programmable memory controller 136 needs a mechanism for dequeuing requests from the request queue 309, and for enqueuing transactions at the transaction queue 312. In one embodiment, to fulfill this need, request processing instructions are equipped with two flags called "R" and "T." An instruction annotated with the R-flag dequeues the request at the head of the request queue 309, and loads the request fields into registers R1-R4 prior to execution; likewise, an instruction annotated with the T-flag enqueues a new transaction based on the contents of registers R5-R8 at the transaction queue 312 after it executes.

In one embodiment, a typical sequence of instructions for processing a request involves copying different fields of the 64-bit request into general purpose registers with the R-flag, operating on these fields to compute channel, rank, bank, row, and column IDs, and copying the resulting transaction fields from the register file to the transaction queue 312 with the T-flag. In one embodiment, a single instruction is allowed to be annotated with both R and T flags, in which case it dequeues a request, operates on it, and enqueues a transaction based on the contents of R5-R8 after it executes. In one embodiment, after a request is dequeued from the request queue 309, its fields are available for processing in the register file; therefore, all request processor 310 instructions may operate on each of the four fields of a request.

Figure 6:
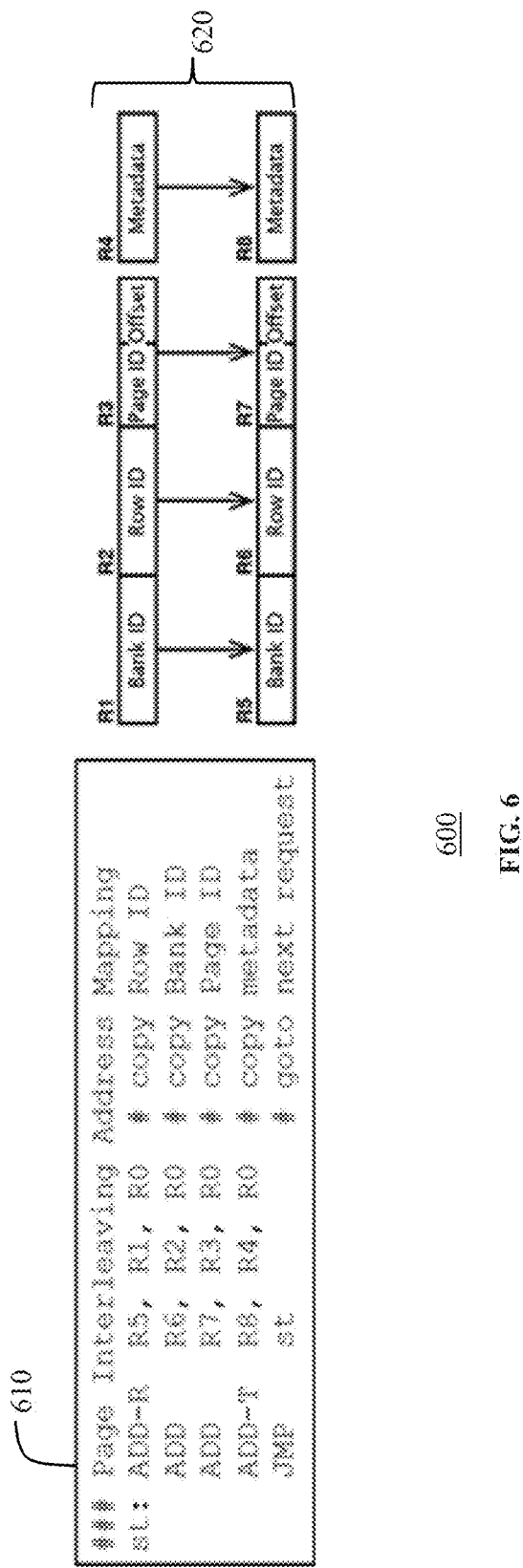
FIG. 6 shows an example of page interleaving address mapping code on the request processor, according to an embodiment.

FIG. 6 shows an example of page interleaving 600 including address mapping code on the request processor 310, according to an embodiment. In one embodiment, registers R1-R4 are used for holding the address (R1-R3) and metadata (R4) fields of the request once the request is dequeued from the request queue 309, and registers R5-R8 are used for enqueuing the next transaction at the transaction queue 312. In one embodiment, the programmable memory controller 136 may either directly copy R1-R4 to R5-R8 to implement page-interleaving, or may operate on R1-R4 to implement more sophisticated address mapping heuristics.

In one embodiment, the example of page interleaving address mapping code 600 shows an example code snippet 610 that implements page-interleaving, the most basic address mapping scheme possible at the request processor 310. As shown, an infinite loop iteratively dequeues the next request, copies the contents of the request registers to transaction registers, and enqueues a new transaction at the transaction queue 312. In one embodiment, the first instruction of the loop is annotated with the R-flag, which forces it to block until the next request arrives and to dequeue this next request prior to execution. Since one source operand of each ADD instruction in the example is the hardwired zero register (R0), each ADD instruction effectively copies one source request register to a destination transaction register. The last ADD instruction is annotated with the T-flag to check for available space in the transaction queue 312, and to enqueue a new transaction. The source and destination registers are shown in the example register flow block 620.

Figure 7:
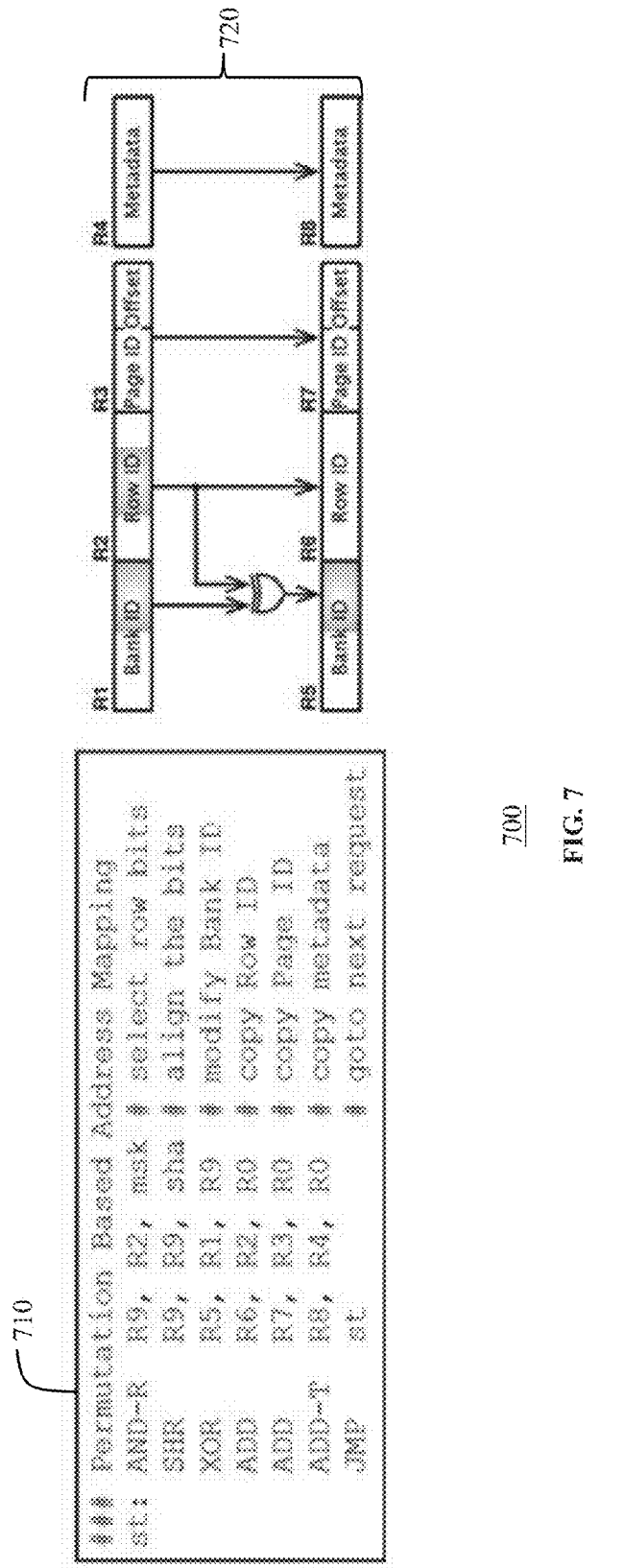
FIG. 7 shows an example of permutation based address mapping code on the request processor, according to an embodiment.

FIG. 7 shows an example of permutation based address mapping code 700 on the request processor 310, according to an embodiment. As a second example of address mapping at the request processor 310, an implementation of permutation based page interleaving 710 is provided. In one embodiment, in every iteration of the address mapping loop, an AND instruction first filters out unwanted bits of the row ID field using a bit mask (the mask is defined based on DRAM parameters, such as the number of banks). In one embodiment, a shift-right logical (SRL) instruction aligns the selected row ID bits with the least significant bits of the bank ID. In one embodiment, an XOR instruction generates the new bank ID for the request, and stores the results in a transaction register. The remaining instructions copy source request registers to destination transaction registers, and ultimately enqueue a transaction at the transaction queue 312. The source and destination registers are shown in the example register flow block 720.

Figure 8:
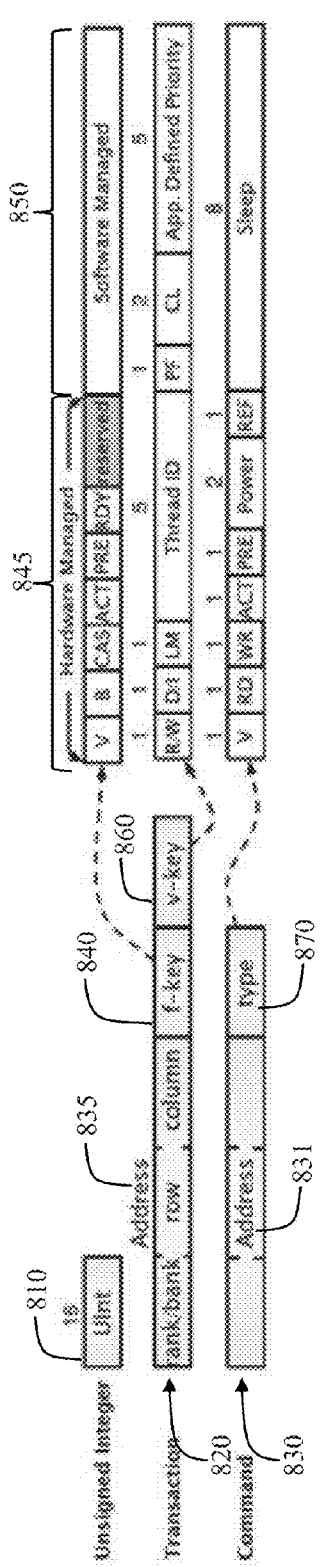
FIG. 8 shows supported data types for a transaction processor, according to an embodiment.

FIG. 8 shows supported data types 800 for a transaction processor 320, according to an embodiment. In one embodiment, similarly to the request processor 310, the transaction processor 320 implements a 16-bit RISC ISA with split instruction and data memories. In one embodiment, unlike the request processor 310, however, the transaction processor 320 is in charge of command scheduling and memory module 137 (e.g., DRAM) management (e.g., power and refresh management), tasks that require much more sophisticated and powerful instructions.

In one embodiment, in addition to a basic 16-bit unsigned integer 810, the transaction processor 320 defines two new data types: a transaction 820 and a command 830. In one embodiment, a transaction 820 comprises of three fields: an address 835, a fixed key 840, and a variable key 860. In one embodiment, the address 835 field is 48 bits wide and is in DRAM-coordinate format, where the least significant bits represent the byte offset, the next few bits represent the page ID, etc. In one embodiment, the fixed key 840 and variable key 860 fields are used for performing associative lookups on the outstanding transactions in the transaction queue 312. In one example, it is possible to search the fixed key 840 fields of all outstanding transactions to identify those transactions that are due to cache-missing loads. In one embodiment, a fixed key 840 is written by the request processor 310, and is read-only and searchable within the transaction processor 320 (the fixed key 840 field holds a replica of the metadata field 422 of the request 420 data type of the request processor 310). In one embodiment, the variable key 860 reflects the state of a transaction based on timing constraints, resource availability, and the state of the memory module 137 (e.g., DRAM system). In one embodiment, using the variable key 860, it is possible, for example, to search for all transactions whose next command is a precharge to a specific bank. In one embodiment, the variable key 860 comprises of two disjoint sections called the hardware managed 845 and software managed 850 parts. In one embodiment, the hardware managed 845 part comprises a valid bit (V), a burst streaming flag (B), three flags indicating the next valid DRAM command for the transaction (i.e., a read, write, precharge, or activate), and a programmed ready bit (RDY). In one embodiment, the hardware managed 845 part keeps getting automatically updated by hardware each cycle, whereas the software managed 850 part can only be modified by a dedicated instruction that overwrites its fields.

In one embodiment, a command 830 comprises of two fields: the address 831 field and the type 870 field. In one embodiment, the command 830 may be a DRAM data transfer command such as a read, write, precharge, or activate, a power management command such as power-up or power-down, a refresh command, or a special "sleep" command that is interpreted by the command logic 330 as a multi-cycle throttling request for active power management.

In one embodiment, the transaction processor 320 provides the programmer with register, data memory, transaction queue 312, and command queue 331 storage abstractions. In one embodiment, the transaction processor 320 has 64 general-purpose registers (R0-R63), with R0 hardwired to zero. In one embodiment, the transaction processor 320 provides 64 special-purpose registers (S0-S63) bundled as an array of counters for implementing timer-based interrupts and statistics counters for decision making. In one embodiment, both the instruction and data memories are accessed by 16-bit addresses, which results in address space sizes of 64 KB each. In one embodiment, the transaction processor 320 accesses the outstanding transactions in the transaction queue 312 via associative search instructions, and generates a command sequence to be enqueued at the command queue 331.

Figure 9:
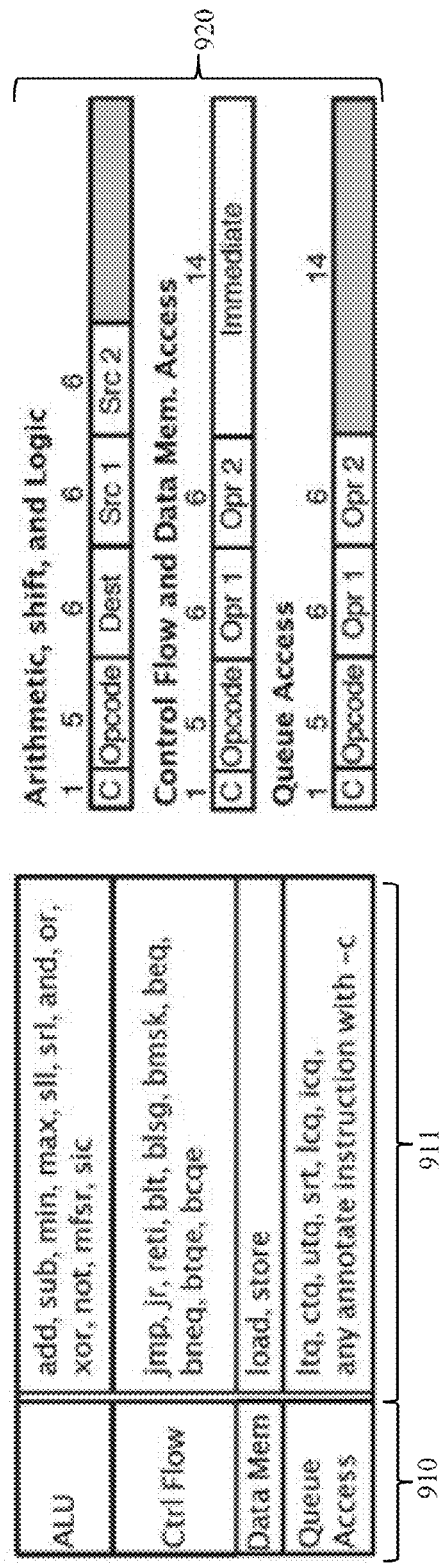
FIG. 9 shows example instruction formats for the transaction processor, according to an embodiment.

FIG. 9 shows example instruction formats 900 and the instruction frame formats 920 of ALU, control flow, memory access and queue access instructions for the transaction processor 320, according to an embodiment. In one embodiment, the transaction processor 320 provides 30 instructions 911 comprising the following operation types 910: ALU, control flow, memory access, interrupt processing, and queue access.

In one embodiment, the transaction processor 320 ISA supports 12 ALU instructions, including ADD, SUB, MIN, MAX, logical shift to left and right, and bitwise logical operations (AND, OR, XOR, NOT). In one embodiment, ten control flow instructions are supported by the transaction processor 320 ISA to help the programmer detect various memory system states and events. In addition to conventional jumps and branches, the transaction processor 320 ISA provides branch if the transaction queue 312 or command queue 331 are empty (BTQE and BCQE) and return from an interrupt service routine (RETI) instructions.

In one embodiment, only loads and stores are permitted to access the data memory, and the only supported addressing mode is displacement (base+register). In one embodiment, the transaction processor 320 provides 64 programmable counters which are used for capturing processor and queue states (e.g., the number of commands issued to the command queue 331). In one embodiment, every counter counts up and fires an interrupt when a pre-programmed threshold is reached. In one embodiment, a programmable interrupt counter is written by a "set interrupt counter" (SIC) instruction, and is read by a "move from special register" (MFSR) instruction. In one embodiment, SIC accepts two register specifiers for setting a counter, and an immediate value to determine the counter ID. In one embodiment, one of the two register operands is the address of the interrupt service routine for handling the interrupt, and the other register is used for specifying the top counter value after which the counter interrupt must fire. In one embodiment, a counter is read by the MFSR instruction, which moves the value of the specified counter to a general purpose register.

In one embodiment, the transaction processor 320 allows the programmer to search for a given transaction by matching against fixed keys 840 and variable keys 860 among all valid transactions in the transaction queue 312; in the case of multiple matches, priority is given to the oldest matching transaction. In one embodiment, prior to a search, the search key is stored in an even numbered register, and the following odd numbered register is used to store a bit-mask that determines which bits from the key should contribute to the search. In one embodiment, a search operation is typically followed by one of three actions: a load transaction, an update transaction and count the number of matches. The fields 920 for the transaction processor 320 operations are shown in detail.

In one embodiment, loading a transaction involves copying the fields of the transaction found by a preceding search operation to a set of registers. In one embodiment, this is accomplished by executing a "load transaction queue" (LTQ) instruction, which loads the command 830 field of the selected transaction 820 (FIG. 8) to a specified destination register, and the address 835 field to a set of dedicated address registers (S64-S66). In one embodiment, if the search operation preceding LTQ results in a mismatch, LTQ sets the valid bit of the command 830 field to zero (future instructions check this bit to determine if the search has succeeded).

In one embodiment, the transaction processor 320 allows the programmer to update a transaction using the "update transaction queue" (UTQ) instruction. In one embodiment, the lower eight bits of the immediate field of UTQ are written into the software managed 850 part of the variable key 860. In one embodiment, this allows firmware to classify matches based on decision making requirements; for example, a batch-scheduler algorithm may mark a new batch of transactions using UTQ.

In one embodiment, using a "count transaction queue" (CTQ) instruction, the programmer may count the number of the transactions that match the preceding search, and may store the result in a specified destination register. In one embodiment, this capability allows the programmable memory controller 136 to make decisions according to the demand for different memory module 137 (e.g., DRAM) resources; for example, a rank with no pending requests may switch to a low power state, or a heavily contended bank may be prioritized over others.

In one embodiment, eventually, a DDRx command sequence is created for each transaction in the transaction processor 320 and enqueued in the command queue 331. In one embodiment, the transaction processor 320 allows the programmer to issue a legal command to the command queue 331 by placing the command 830 type and the address 831 in a set of command registers, and then executing an "issue command queue" (ICQ) instruction. In one embodiment, an alternative to using ICQ is to use a command flag that may be added to any instruction (-C). In one embodiment, in addition to precharge, activate, read, and write commands, the programmable memory controller 136 may also issue a "sleep" command to throttle the memory module 137 (e.g., DRAM system) for active power management. In one embodiment, the sleep command specifies the number of cycles for which the command logic 330 should stall once the sleep command reaches the head of the command queue 331. In one embodiment, other DRAM maintenance commands allow changing DRAM power states, and issuing a refresh to the memory module 137 (e.g., DRAM subsystem).

In one embodiment, by relying on dedicated command logic 330 to stall each command until it is free of all timing constraints, the PARDIS architecture of the programmable memory controller 136 allows the programmer to write firmware code for the DDRx memory module 137 (e.g., DRAM system) without worrying about timing constraints or synchronization with the DRAM clock. However, knowing the time at which different commands will become ready to issue is still critical to deriving a high-performance, efficient command schedule. In one embodiment, to allow the programmable memory controller 136 to deliver better performance by inspecting when a command will become ready, a ready bit is added to each transaction; by default, the ready bit indicates that the command will be ready in the next clock cycle; however, the programmer may change this to a larger number of cycles using a "set ready threshold" (SRT) instruction as desired.

Figure 10:
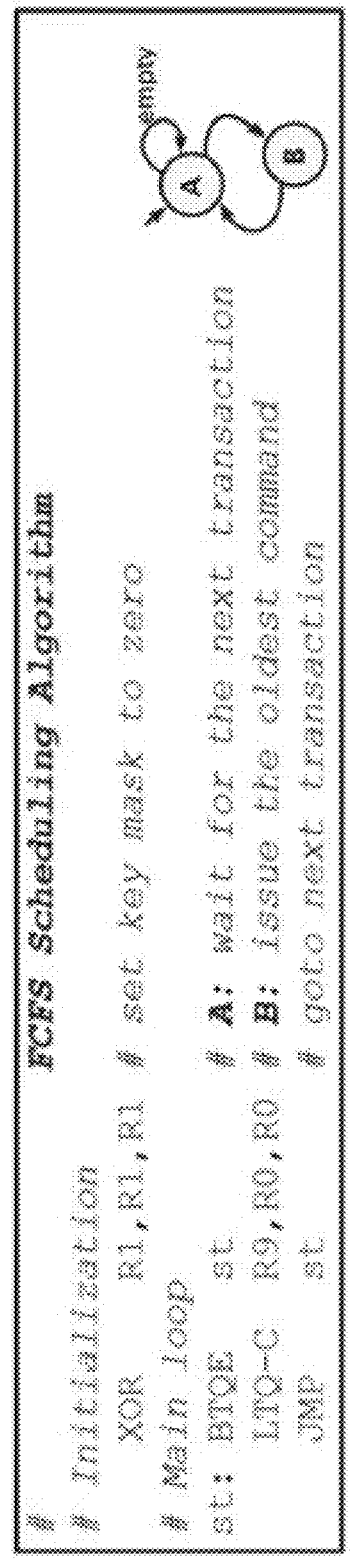
FIG. 10 shows an example transaction processing code for first-come-first-serve (FCFS) scheduling, according to an embodiment.

FIG. 10 shows an example transaction processing code 1000 for first-come-first-serve (FCFS) scheduling, according to an embodiment. In one example embodiment of transaction scheduling, the programmable memory controller 136 may emit the next valid memory (e.g., DRAM) command of the oldest transaction, and may process all requests in the same order that they arrive at the request processor 310. An example of transaction processing code of the FCFS scheduling 1000 shows a code snippet, wherein an infinite loop with three instructions is provided. A BTQE instruction keeps checking the empty flag of the transaction queue until it reads a zero. The second instruction is a load (LTQ) from transaction queue 312, which is annotated with the C-flag. Since the key mask register (R1) for specifying which bits of the variable key 860 and the fixed key 840 should be searched is initialized to zero, this instruction simply searches for a valid transaction in the transaction queue 312. In one embodiment, because of the annotation with the C-flag, the LTQ instruction creates a command (based on the state of the transaction) in the destination register (in this example, R9) and in the command address registers. Then, based on the valid bit of the command (now in R9), the LTQ instruction decides whether to enqueue the command in the command queue 331.

FIG. 11 shows an example transaction processing code 1100 for first-ready (FR)-FCFS scheduling, according to an embodiment. In one example embodiment, a code snippet 1100 for a higher-performance, FR-FCFS policy is shown. In one embodiment, the FR-FCFS considers memory module 137 (e.g., DRAM) resource availability and the state of each transaction to reduce the overall latency of a DRAM access. The example code uses an infinite loop to receive the next transaction and to generate the corresponding commands. In the body of the loop, a transaction is prioritized based on the type of the next DRAM command it requires. A sequence of LTQ instructions are used to find matches for a specific variable key 860. The first LTQ instruction uses a pair of key and mask (R10, R11) registers holding a bit pattern that represents all transactions with a ready read or write command. Therefore, this instruction searches for the oldest ready DRAM column access command, and issues the command to the command queue 331. The following instruction checks the valid bit of the command placed in R1, and starts scheduling the next command if a valid column access was found. If, on the other hand, no ready read or write command was available, the next two instructions search for a valid activate command and issue the activate if one is found. Otherwise, the example code searches for a ready precharge command, and if found, issues the precharge. In one embodiment, ready DRAM commands are prioritized over commands that are not ready using the bit masks, while the order in which instructions are executed enforces a descending priority from column reads and writes to activate and precharge commands.

Figure 12:
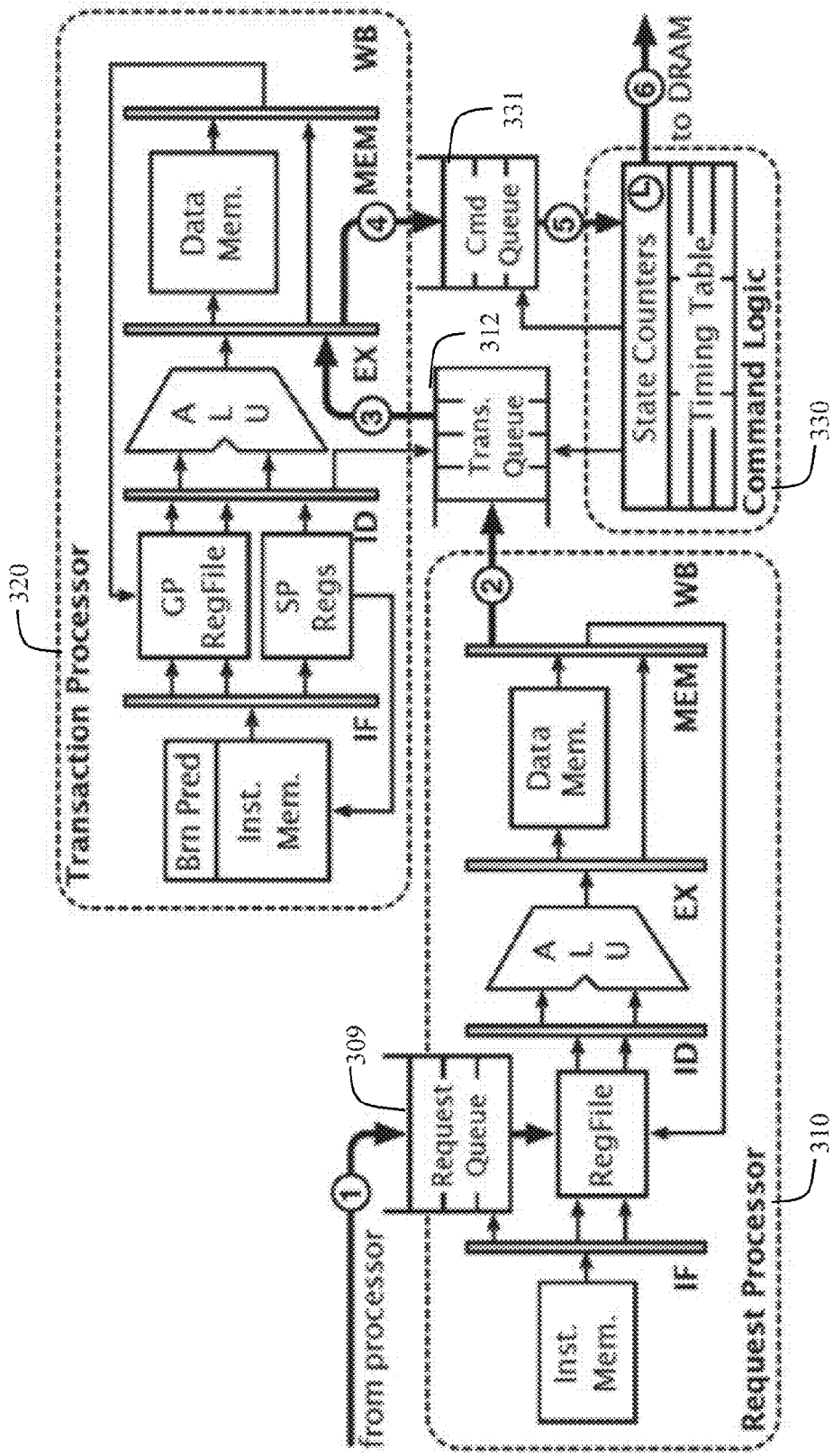
FIG. 12 shows an example architecture and flow for a programmable memory controller, according to an embodiment.

FIG. 12 shows an example architecture and flow for a programmable memory controller 136, according to an embodiment. In one embodiment, depending on performance needs, either a scalar or a superscalar implementation of the request processor 310 and transaction processor 320 may be devised. In one embodiment, a scalar pipelined implementation of the PARDIS architecture for the programmable memory controller 136 is shown in FIG. 12. In one embodiment, a procedure for processing an incoming memory request (e.g., a DRAM request), and ultimately generating the corresponding DRAM command stream comprises multiple procedures. In one embodiment, a unique request ID (URID) is assigned to a new DRAM request before it is enqueued at the FIFO request queue 309; the URID accompanies the request throughout the pipeline (e.g., 1-6), and is used to associate the request with commands and DRAM data blocks. In one embodiment, after a request is processed and its DRAM coordinates are assigned, a new transaction for the request is enqueued at the transaction queue 312. In one embodiment, at the time the transaction is enqueued, the fixed key 840 of the transaction is initialized to the request 420 type, while the variable key 860 is initialized based on the current state of the memory module 137 (e.g., DRAM subsystem). In one embodiment, although transactions enter the transaction queue 312 in FIFO order, a queued transaction is typically prioritized based on fixed key 840 and variable key 860 (at 3), after which the transaction processor 320 issues the next command of the transaction to the command queue 331 (at 4). In one embodiment, commands that are available in the command queue 331 are processed by the command logic 330 in FIFO order (at 5). In one embodiment, a DRAM command is only dequeued when it is ready to appear on the DDRx command bus (at 6), and is issued to the memory module 137 (e.g., DRAM subsystem) at the next rising edge of the DRAM clock.

In one embodiment, the request processor 310 implements a five-stage pipeline with a read interface to the request queue 309 and a write interface to the transaction queue 312. In one embodiment, in the first stage of the pipeline, an instruction is fetched from the instruction memory. In one embodiment, all branches are predicted taken, and on a branch misprediction, the over-fetched wrong-path instruction is nullified. In one embodiment, in the second stage, the fetched instruction is decoded to extract control signals, operands are read from the register file, and the next request is dequeued from the request queue 309 if the instruction is annotated with an R-flag. In one embodiment, if a request must be dequeued but the request queue 309 is empty, the request processor 310 stalls the decode and fetch stages until a new request arrives at the request queue 309 (instructions in later pipeline stages continue uninterrupted). In one embodiment, request registers (R1-R4) may only be written from the request queue 309 side (on a dequeue), and are read-only to the request processor 310. In one embodiment, in the third pipeline stage, a simple 16-bit ALU executes the desired arithmetic and logical operation, and computes the effective address if the instruction is a load or a store. In one embodiment, loads and stores access the data memory in the fourth stage. In one embodiment, in the final stage of the pipeline, the result of every instruction is written back to the register file, and if the T-flag of the instruction is set, a new transaction is enqueued at the transaction queue 312.

In one embodiment, the transaction processor 320 is a 16-bit, five-stage pipelined processor. In one embodiment, in the first stage of the pipeline, the transaction processor 320 fetches the next instruction from a 64 KB instruction memory. In one embodiment, branch and jump instructions are divided into two categories: fast and slow. In one embodiment, fast branches include jump and branch on queue status instructions (BTQE and BCQE), for which the next instruction may be determined in the fetch stage; as such, these branches incur no performance losses due to branch mispredictions. In one embodiment, slow branches, on the other hand, depend on register contents and are predicted by an 8K-entry g-share branch predictor. In one embodiment, critical branches in the transaction processor 320 are usually coded using the fast branch instructions (e.g., infinite scheduling loops, and queue state checking instructions).

In one embodiment, in the second pipeline stage, the instruction is decoded, general- and special-purpose registers are read, and special-purpose interrupt registers are set. In one embodiment, special purpose registers are implemented using a 64-entry array of programmable counters.

Figure 13:
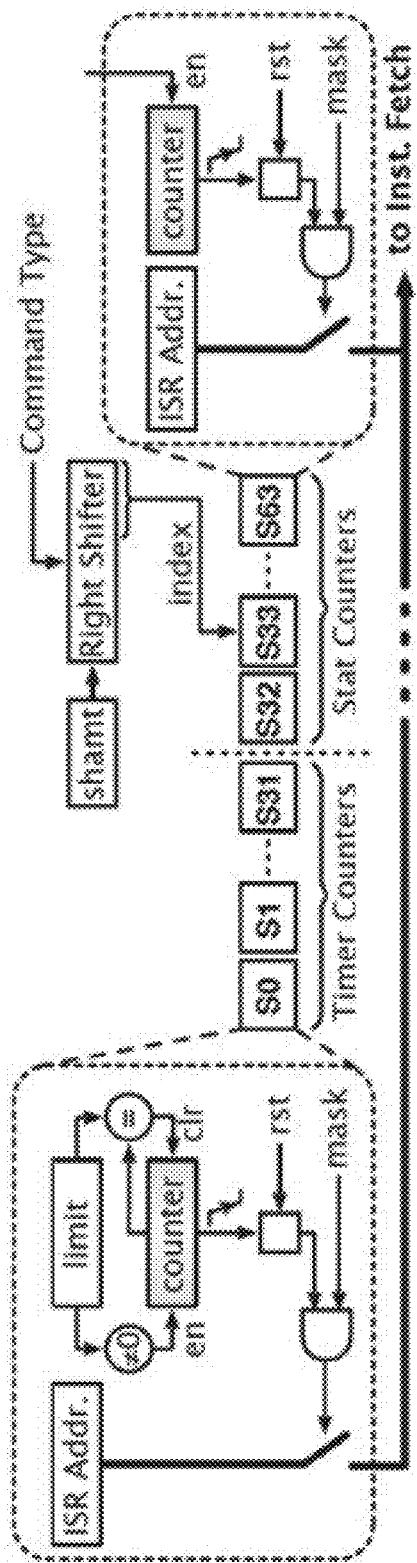
FIG. 13 shows programmable interrupt counters in an architecture for a programmable memory controller, according to an embodiment.

FIG. 13 shows programmable interrupt counters 1300 in an architecture for a programmable memory controller 136, according to an embodiment. In one embodiment, 32 of the programmable counters (S0-S31) are used for timer interrupts, and the remaining 32 programmable counters (S32-S63) are used for collecting statistics to aid in decision-making. In one embodiment, for every timer, there are two registers holding the interrupt service routine address and the maximum counter value after which an interrupt must fire. In one embodiment, every time the counter resets, an interrupt is fired and latched in an interrupt flop. In one embodiment, there is a descending priority from S0 to S63 among all interrupt timers. In one embodiment, to prevent nested interrupts, a busy flag masks all other interrupts until the current interrupt finishes with a RETI instruction, which resets the busy flag and the corresponding interrupt flop.

Figure 14:
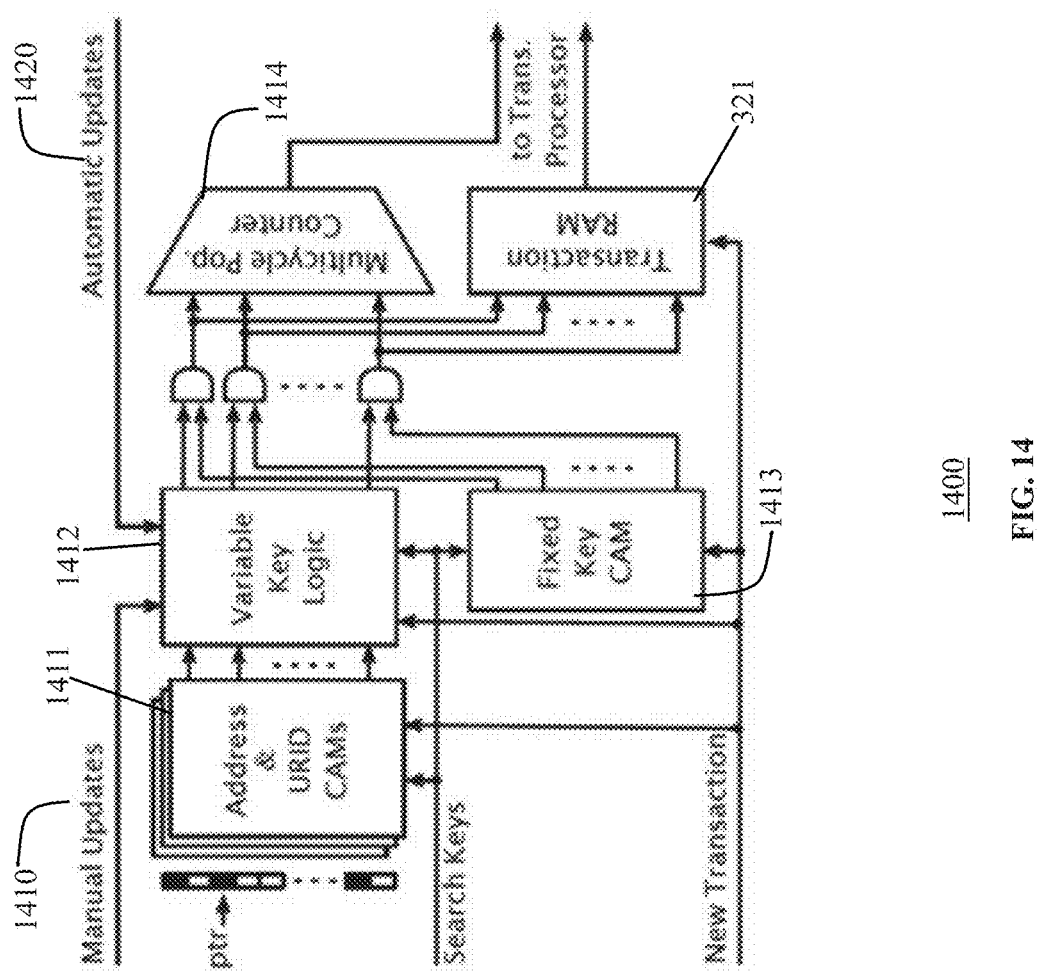
FIG. 14 shows an architecture for a transaction queue, according to an embodiment.

In one embodiment, after decode, a 16-bit ALU performs arithmetic and logic operations; in parallel, the transaction queue 312 is accessed. FIG. 14 shows an architecture 1400 for a transaction queue 312, according to an embodiment. In one embodiment, manual updates 1410 and automatic updates 1420 are provided to the variable key logic 1412. In one embodiment, the architecture 1400 for the transaction queue 312 comprises the following: 1) five 64-entry content-addressable memories (CAMs) 1411, one each for the rank, bank, row, column, and unique request IDs, 2) a 64-entry CAM storing variable keys 1412, 3) a 64-bit population counter 1414, 4) a 64-entry CAM holding fixed keys 1413, and 5) a 64×86 bit RAM 321 (see also FIG. 3) holding a copy of the fixed data for the transaction (i.e., the address, the fixed key, and the URID).

In one embodiment, the transaction queue 312 is accessible in four ways: adding a new transaction, searching for a transaction, updating the variable keys, and reading search results. In one embodiment, if the transaction queue 312 is not full, a new transaction is written to the transaction queue 312 by updating the content of the address and URID CAMs, variable keys 860, fixed keys 840, and the transaction data. In one embodiment, even though transactions are allowed to leave the transaction queue 312 out of order, the transaction queue 312 employs a circular enqueuing technique that maintains an oldest-first order among occupied entries.

In one embodiment, for all instructions that need to search the transaction queue 312, the fixed key CAM 1413 and variable key CAM 1412 are accessed with the corresponding search keys. Every key is accompanied by a mask indicating which subset of the bits within the key should contribute to the search (other bit positions are ignored by hardware). In one embodiment, the fixed CAM 1413 and variable key CAM 1412 provide match results to the transaction RAM 321 (for retrieving the DRAM address to be accessed by the selected transaction) and to the population count logic of the population counter 1414 (for counting the number of matches).

In one embodiment, the variable key logic 1412 CAM receives updates to the variable key 860 from the transaction processor 320 and command logic 330. In one embodiment, updates to the software-managed 850 part of the variable key 860 are generated by a UTQ instruction, whereas the hardware managed 845 part of the variable key 860 is automatically updated after every state change.

In one embodiment, after a search, the number of matching transactions may be obtained from a population counter 1414, and the DRAM address of the highest-priority matching transaction may be obtained from a transaction RAM 321. In one embodiment, command queue 331 and data memory accesses occur in the fourth stage of the pipeline, and the result of the instruction is written back to the register file in the fifth stage.

Figure 15:
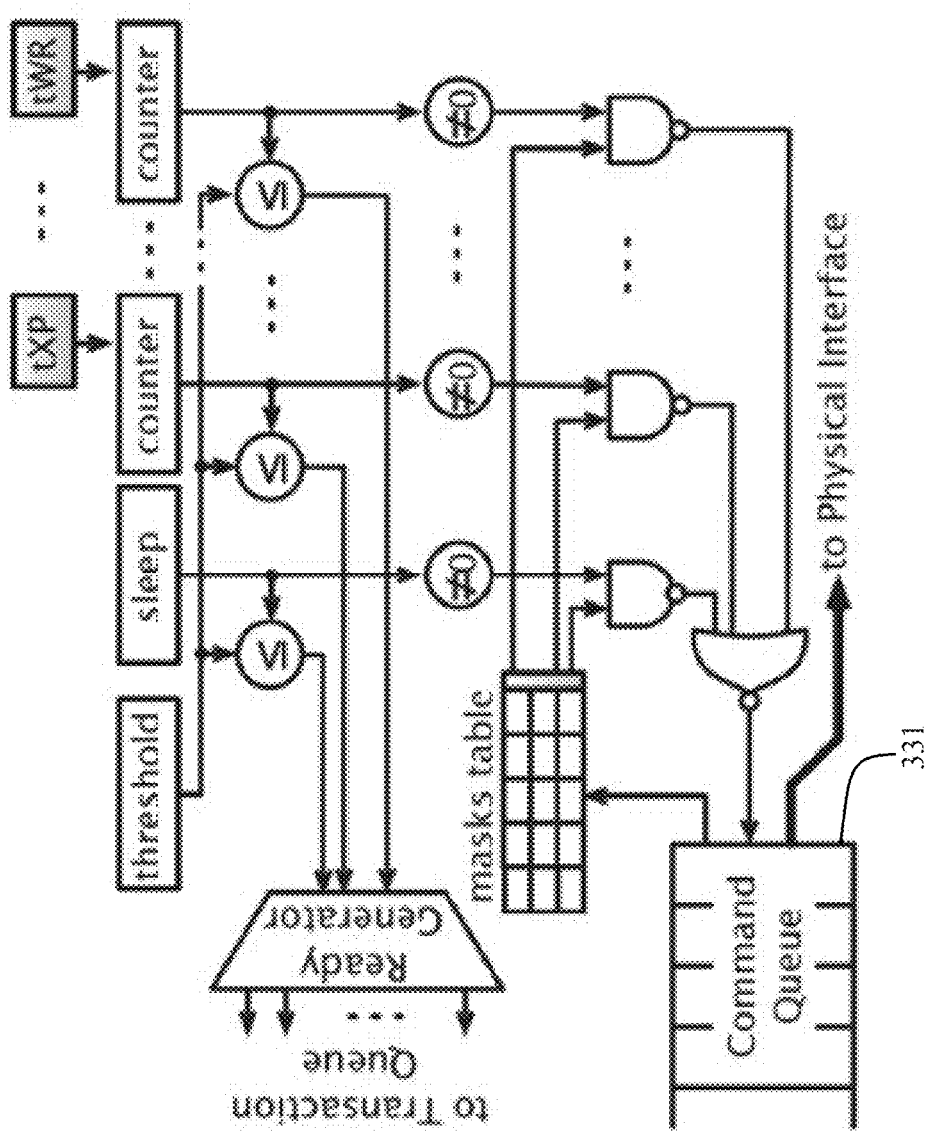
FIG. 15 shows an architecture for command logic, according to an embodiment.

FIG. 15 shows an architecture 1500 for command logic 330, according to an embodiment. In one embodiment, the command logic 330 is implemented using masking and timing tables initialized at boot time based on DDRx parameters, and a dedicated down-counter for each DRAM timing constraint imposed by the DDRx standard (the counters are updated every DRAM clock cycle). In one embodiment, every DRAM clock cycle, the command at the head of the command queue 331 is inspected, and the masking table is accessed to retrieve a bit mask that is used to mask out timing constraints that are irrelevant to the command under consideration (e.g., tCL in the case of a precharge command). In one embodiment, the remaining (unmasked) timers are used to generate a ready signal indicating whether the command is ready to be issued to the memory module 137 (e.g., DRAM subsystem) at the next rising edge of the DRAM clock.

In one example embodiment, the performance potential of the PARDIS architecture for the programmable memory controller 136 is explored by comparing (conventional) ASIC and PARDIS-based firmware implementations of FCFS, FR-FCFS, Par-BS, and TCMS scheduling algorithms. In one example of an embodiment, a DRAM power management process is used for comparison, where both the performance and the energy of the example embodiment is compared to the ASIC version of the same algorithm. In one example, DRAM refresh management is evaluated for one embodiment by comparing the ASIC implementation of an elastic refresh technique to its firmware implementation for an embodiment. In one example, an evaluation of the performance potential of application-specific optimizations enabled by an embodiment using PARDIS for the programmable memory controller 136 by implementing custom address mapping mechanisms. In another example embodiment, DRAM energy and system performance is evaluated by simulating twelve (12) memory-intensive parallel applications, running on a heavily modified version of a SuperScalar (SESC) simulator. In one example, a measure of the physical area, frequency, and power dissipation of PARDIS implemented for an embodiment of the programmable memory controller 136 is evaluated by implementing the embodiment in Verilog hardware description language (HDL), and synthesizing hardware.

In one example embodiment, for evaluation the SESC simulator is modified to model an eight-core system with a 4 MB L2 cache and two on-chip memory controllers. Table 1 shows the example simulation parameters. In the simulated configuration, memory channels are fully populated with DIMMs (typical of server systems, which restrict the maximum channel data-rate to 800 MT/s for DDR3-1066. This example results in a core-to-DRAM clock ratio of five. Energy results for the DRAM subsystem are generated based on DDR3-1066 product data.

TABLE 1

| | |
|---|---|
| Core | 8 4-issue cores, 2.0 GHz |
| Functional units IQ, LSQ, ROB size | Int/FP/Ld/St/Br units 2/2/2/2/2, Int/FP Mult 1/1 IssueQ 32, LoadQ/StoreQ 24/24, ROB 96 |
| Physical Registers | Int/FP 96/96 |
| Branch Predictor | Hybrid, local/global/meta 2K/2K/8K, 512-entry direct-mapped BTB, 32-entry RAS |
| IL1 Cache (per core) | 32 KB, direct-mapped, 32 B block, hit/miss delay 2/2 |
| DL1 Cache (per core) | 32 KB, 4-way, LRU, 32 B block hit/miss delay 3/3, MESI protocol |
| L2 Cache (shared) | 4 MB, 8-way, LRU, 64 B block, hit/miss delay 24/24 |
| PARDIS | 2.0 GHz, request/transaction/command queue size 64/64/64 |
| DRAM Subsystem Timing (DRAM Cycles) | 8 Gb DDR3-1066, 2 Channels, 4 Ranks, 8 Banks tRCD: 7, tCL: 7, tWL: 6, tCCD: 4, tWTR: 4, tWR: 8, tRTP: 4, tRP: 7, tRRD: 4, tRAS: 20, tRC: 27, tBURST: 4, tFAW: 20 |
| Energy (Current mA) | IDD0: 1314, IDD1: 1584, IDD2P: 288, IDD2N: 1620, IDD3P: 1080, IDD3N: 1800, IDD4R: 2304, IDD4W: 2304, IDD5B: 3297, IDD6: 216 |

In one example evaluation of an embodiment, evaluated parallel workloads represent a mix of 12 data-intensive applications from Phoenix, SPLASH-2, SPEC OpenMP, NAS, and Nu-MineBench suites. Table 2 summarizes the evaluated benchmarks and their input sets

TABLE 2

| Benchmarks | Suite | Input | Description |
|---|---|---|---|
| Histogram | Phoenix | 34,843,392 pixels (104 MB) | pixel value distribution in bitmap image |
| String-Match | Phoenix | 50 MB non-encrypted file | string search on encrypted file |
| Word-Count | Phoenix | 10 MB text file | Count frequencies of distinct words |
| Scalparc | Data Mining | 125K pts., 32 attributes | Decision Tree |
| MG | NAS OpenMP | Class A | Multigrid Solver |
| CG | NAS OpenMP | Class A | Conjugate Gradient |
| Swim-Omp | SPEC OpenMP | MinneSpec-Large | Shallow Water model |
| Equake-Omp | SPEC OpenMP | MinneSpec-Large | Earthquake model |
| Art-Omp | SPEC OpenMP | MinneSpec-Large | Self-Organizing Map |
| Ocean | SPLASH-2 | 514→/514 ocean | Ocean movements |
| FFT | SPLASH-2 | 1M points | Fast Fourier Transform |
| Radix | SPLASH-2 | 2M integers | Integer radix sort |

In one example, the area and power overheads of an embodiment architecture is evaluated by implementing in Verilog HDL and synthesizing the design using Cadence Encounter RTL Compiler with FreePDK at 45 nm. The results are then scaled to 22 nm (relevant parameters are shown in Table 3).

TABLE 3

| Technology | Voltage | FO4 Delay |
|---|---|---|
| 45 nm | 1.1 V | 20.25 ps |
| 22 nm | 0.83 V | 11.75 ps |

In one example, instruction and data memories are evaluated using CACTI 6.0, while register files and CAMs are modeled through SPICE simulations with the FabMem toolset from FabScalar.

FIG. 16A shows a delay comparison 1601, FIG. 16B shows a physical area comparison 1602, and FIG. 16C shows a peak power comparison 1603 for an example implementation of a programmable memory controller 136 and counterpart ASIC implementations, according to an embodiment. In one example, a fully synthesizable implementation of PARDIS for the programmable memory controller 136 at 22 nm operates at over 2 GHz, occupies 1.8 mm² of die area, and dissipates 138 mW of peak power; higher frequencies, lower power dissipation, or a smaller area footprint may be attained through custom-rather than fully synthesized-circuit design. In one example embodiment, although most of the area is occupied by request processor 310 and transaction processor 320, the transaction queue 312—which implements associative lookups using CAMs—is the most power-hungry component (29%). In one example embodiment, other major consumers of peak power are the transaction processor 320 (29%) and the request processor 310 (28%).

Figure 17:
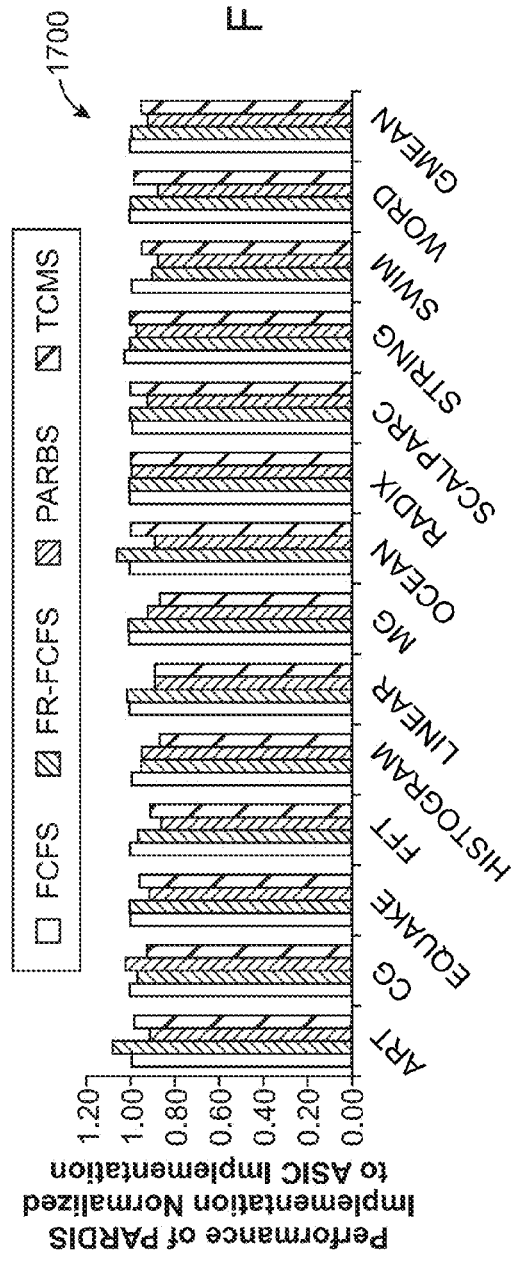
FIG. 17 shows a performance comparison for an example implementation of a programmable memory controller and ASIC implementations, according to an embodiment.

FIG. 17 shows a performance comparison 1700 for an example implementation of a programmable memory controller 136 and counterpart ASIC implementations, according to an embodiment. In one example embodiment, the comparison 1700 compares PARDIS-based firmware implementations for the programmable memory controller 136 of FCFS, FR-FCFS, Par-BS, and TCMS scheduling algorithms to their ASIC implementations. In the example embodiment, PARDIS implementation for the programmable memory controller 136 achieves virtually the same performance as an ASIC implementation on FCFS and FR-FCFS schedulers across all applications. For a few benchmarks (e.g., ART and OCEAN with FR-FCFS), the PARDIS version of a given scheduling algorithm for the programmable memory controller 136 outperforms the ASIC implementation of the same algorithm by small margins. This improvement is an artifact of the higher latency incurred in decision making when using PARDIS for the programmable memory controller 136, which generally results in greater queue occupancies than an ASIC. As a result of having more requests to choose from, the scheduling algorithm is able to exploit bank parallelism and row buffer locality more aggressively under the PARDIS implementation for the programmable memory controller 136. However, for one embodiment, for Par-BS and TCMS—two compute-intensive scheduling algorithms—PARDIS for the programmable memory controller 136 suffers from higher processing latency, and performance is degraded by 8% and 5%, respectively.

Figure 18:
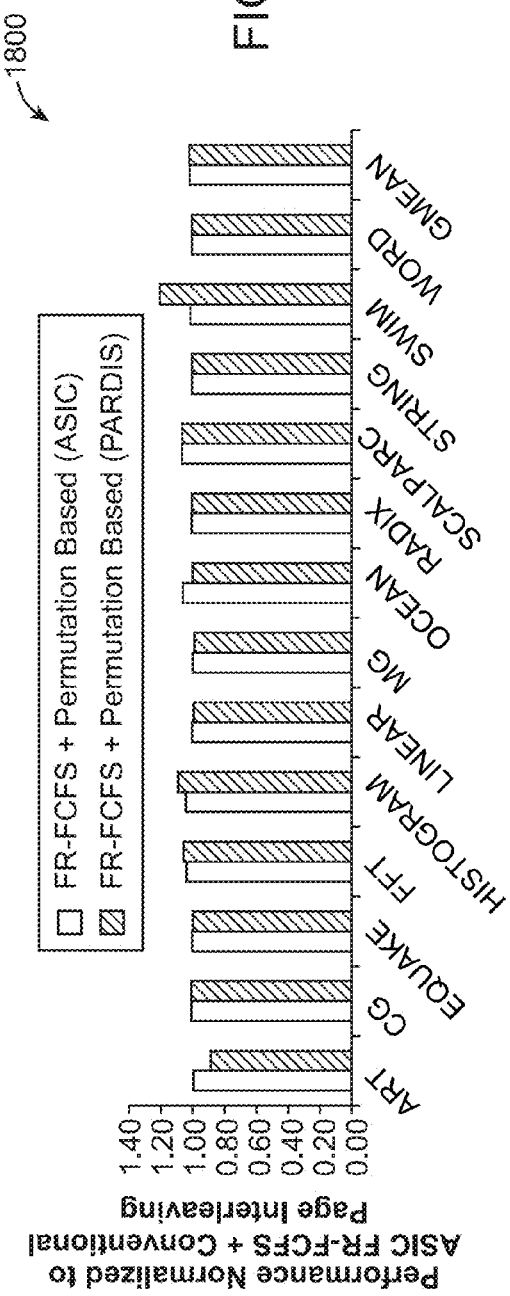
FIG. 18 shows a performance comparison for an example implementation of a programmable memory controller and ASIC implementations of permutations based address mapping, according to an embodiment.

FIG. 18 shows a performance comparison 1800 for an example implementation of the programmable memory controller 136 and counterpart ASIC implementations of permutations based address mapping, according to an embodiment. To evaluate the performance of different DRAM address mapping techniques on PARDIS for the programmable memory controller 136, the permutation-based interleaving technique was mapped onto PARDIS and compared to its ASIC implementation in the comparison 1800. In one example embodiment, the average performance of the ASIC and PARDIS implementations for the programmable memory controller 136 differ by less than 1%. PARDIS for the programmable memory controller 136, however, outperforms the ASIC by a small margin on some applications. In one embodiment, PARDIS for the programmable memory controller 136 incurs a higher request processing latency than the ASIC, which results in a higher request queue occupancy. In a scheduling algorithm that searches for specific commands (e.g., FR-FCFS, which searches for row hits), increasing the number of candidate commands sometimes improves performance (SWIM, FFT, and HISTOGRAM in FIG. 18). Other applications, such as ART and OCEAN, do not benefit from this phenomenon.

Figure 19:
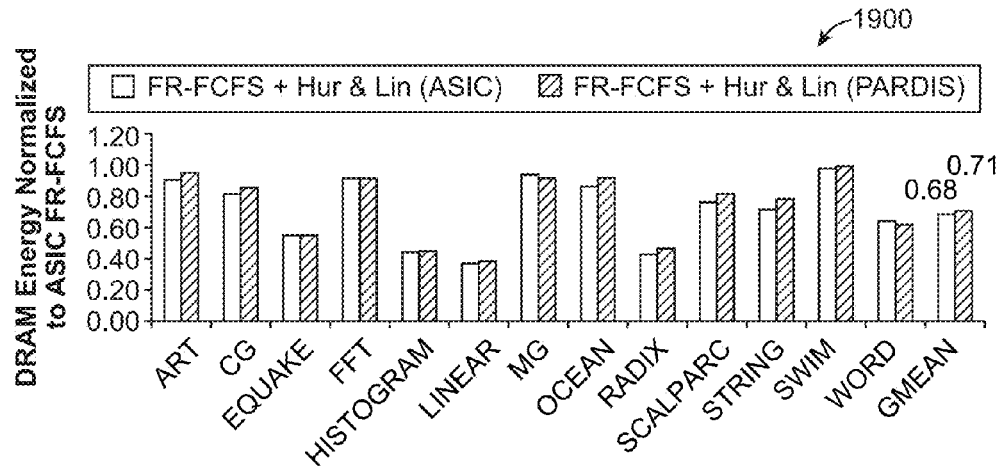
FIG. 19 shows a DRAM energy comparison for an example implementation of a programmable memory controller and ASIC implementations for power management technique, according to an embodiment.
Figure 20:
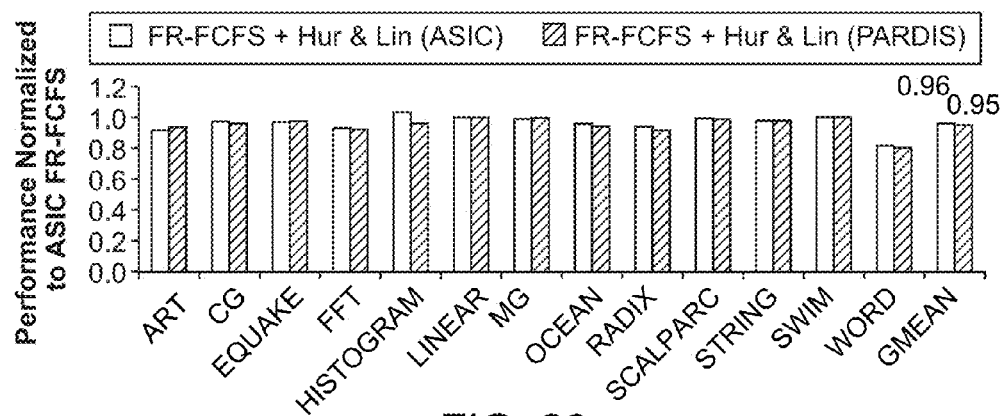
FIG. 20 shows a performance comparison for an example implementation of a programmable memory controller and ASIC implementations for power management technique, according to an embodiment.
Figure 21:
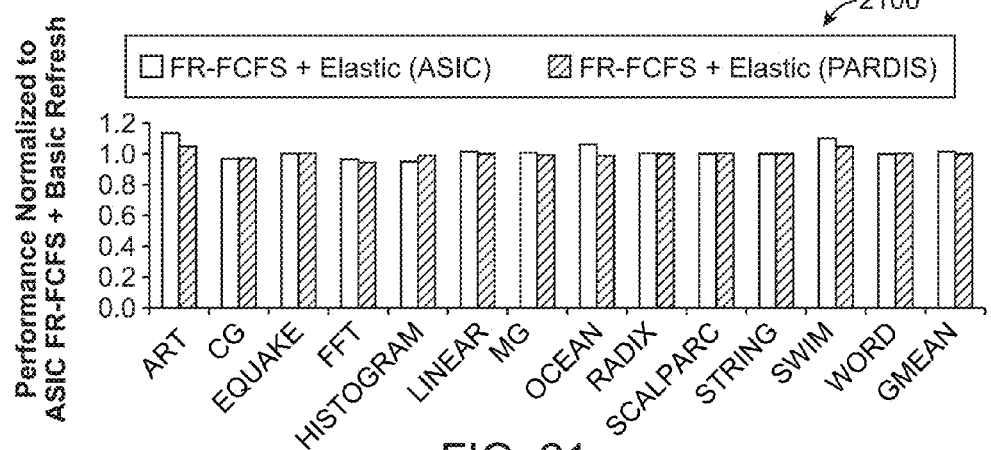
FIG. 21 shows a performance comparison for an example implementation of a programmable memory controller and ASIC implementations of an elastic refresh scheduling algorithm, according to an embodiment.

FIG. 19 shows a DRAM energy comparison 1900 for an example implementation of the programmable memory controller 136 and ASIC implementations for power management technique, according to an embodiment. FIG. 20 shows a performance comparison 2000 for an example implementation of the programmable memory controller 136 and ASIC implementations for power management technique, according to an embodiment. In one example embodiment, DRAM power management with PARDIS for the programmable memory controller 136 was evaluated by implementing a queue-aware power management technique in firmware, and comparing the results to an ASIC implementation; in both cases, the underlying command scheduling algorithm is FR-FCFS. In one example embodiment, the ASIC implementation reduces average DRAM energy by 32% over conventional FR-FCFS at the cost of 4% lower performance. In one example embodiment, the firmware implementation of queue-aware power management with PARDIS for the programmable memory controller 136 shows similar results: 29% DRAM energy savings are obtained at the cost of a 5% performance loss FIG. 21 shows a performance comparison 2100 for an example implementation of the programmable memory controller 136 and ASIC implementations of an elastic refresh scheduling algorithms, according to an embodiment. In order to evaluate DRAM refresh management on PARDIS for the programmable memory controller 136, in one example a conventional on-demand DDR3 refresh method is considered as the baseline to which the ASIC and PARDIS-based implementations for the programmable memory controller 136 of an elastic refresh algorithm are compared. In one example embodiment, the PARDIS-based refresh mechanism implementation for the programmable memory controller 136 takes advantage of interrupt programming to manage the state of the ranks and to issue refresh commands at the right time. In one example embodiment, the results indicate that the average performance of firmware-based elastic refresh is within 1% of the ASIC performance.

FIG. 22 shows a speedup comparison 2200 for an example implementation of the programmable memory controller 136 over ASIC implementations and TCMS scheduling algorithms using application-specific mapping on PARDIS, according to an embodiment. FIG. 23 shows DRAM energy savings comparison 2300 for an example implementation of the programmable memory controller 136 over ASIC implementations and TCMS scheduling algorithms using application-specific mapping on PARDIS, according to an embodiment. The number of row buffer hits in the DRAM subsystem profoundly impacts system performance. In one example embodiment, an application specific address mapping technique is used to increase the number of row hits in the memory request stream, relying on a profiling analysis of each application to optimize request distribution to DRAM banks (for simplicity, each DRAM coordinate is restricted to a contiguous sequence of bits). As shown in comparison 2200, application-specific DRAM indexing improves performance for an example embodiment by 31%, 18%, 10%, and 6% over permutation-based interleaving for FCFS, FR-FCFS, Par-BS and TCMS, respectively; corresponding DRAM energy savings are 22%, 17%, 14%, and 9% as shown in comparison 2300.

For one or more embodiments, compared to an ASIC DDRx memory controller, PARDIS for the programmable memory controller 136 provides significant flexibility in supporting a diverse set of capabilities through firmware-based programmable control, ease of applying revisions to the implemented memory controllers through firmware patches, and configurability in interfacing to different media. One or more embodiments, as compared to an ASIC memory controller, PARDIS for the programmable memory controller 136 supports application specific optimizations and multi-functionality that results in both power and performance benefits. One or more embodiments provide optimizations down to DRAM structures, such as ranks, banks, and rows.

Figure 24:
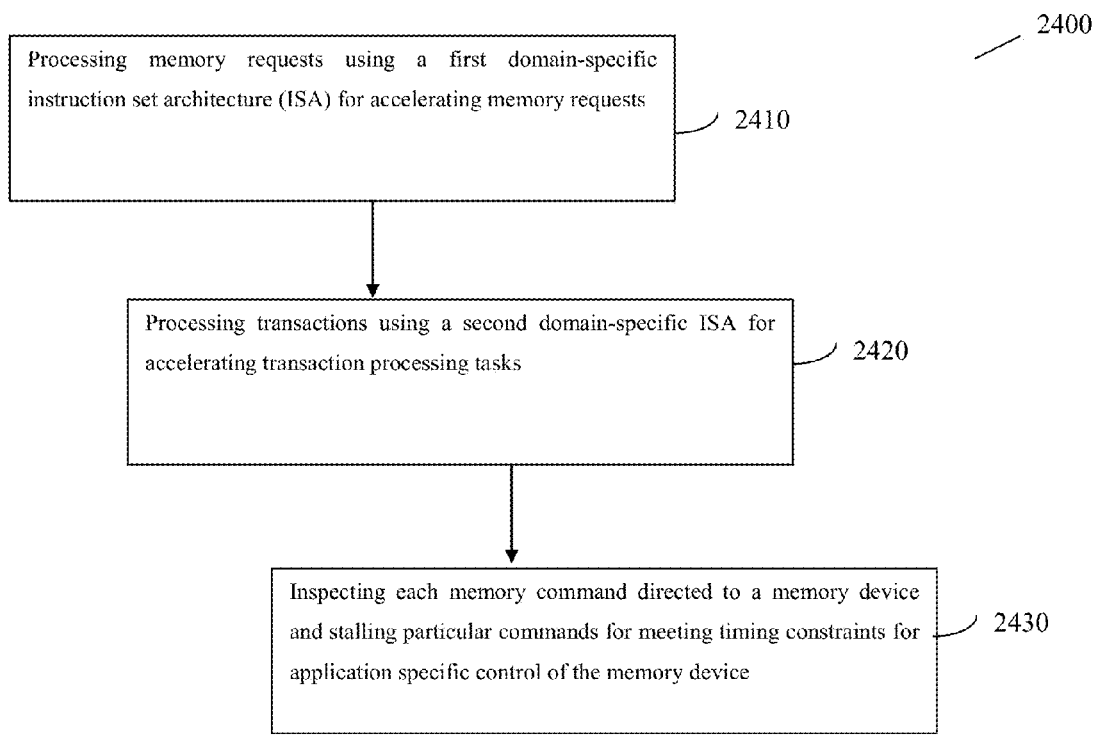
FIG. 24 shows a flow process for memory request processing using a programmable memory controller architecture, according to an embodiment.

FIG. 24 shows a flow process 2400 for memory request processing using a programmable memory controller 136 architecture, according to an embodiment. In one embodiment, block 2410 provides processing (e.g., using a request processor 310) memory requests using a first domain-specific ISA for accelerating memory requests. In one embodiment, block 2420 provides processing (e.g., using a transaction processor 320) transactions using a second domain-specific ISA for accelerating transaction processing tasks. In one embodiment, block 2430 provides inspecting each memory command directed to a memory device (e.g., memory module 137) and stalling particular commands for meeting timing constraints for application specific control of the memory device (using, e.g., command logic 330).

As is known to those skilled in the art, the aforementioned example architectures described above, according to said architectures, can be implemented in many ways, such as program instructions for execution by a processor, as software modules, microcode, as computer program product on computer readable media, as analog/logic circuits, as application specific integrated circuits, as firmware, as consumer electronic devices, AV devices, wireless/wired transmitters, wireless/wired receivers, networks, multi-media devices, etc.

Further, embodiments of said Architecture can take the form of an entirely hardware embodiment, an entirely software embodiment or an embodiment containing both hardware and software elements.

Embodiments have been described with reference to flowchart illustrations and/or block diagrams of methods, apparatus (systems) and computer program products according to one or more embodiments. Each block of such illustrations/diagrams, or combinations thereof, can be implemented by computer program instructions. The computer program instructions when provided to a processor produce a machine, such that the instructions, which execute via the processor, create means for implementing the functions/operations specified in the flowchart and/or block diagram. Each block in the flowchart/block diagrams may represent a hardware and/or software module or logic, implementing one or more embodiments. In alternative implementations, the functions noted in the blocks may occur out of the order noted in the figures, concurrently, etc.

The terms "computer program medium," "computer usable medium," "computer readable medium", and "computer program product," are used to generally refer to media such as main memory, secondary memory, removable storage drive, a hard disk installed in hard disk drive. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Computer program instructions representing the block diagram and/or flowcharts herein may be loaded onto a computer, programmable data processing apparatus, or processing devices to cause a series of operations performed thereon to produce a computer implemented process. Computer programs (i.e., computer control logic) are stored in main memory and/or secondary memory. Computer programs may also be received via a communications interface. Such computer programs, when executed, enable the computer system to perform the features of one or more embodiments as discussed herein. In particular, the computer programs, when executed, enable the processor and/or multi-core processor to perform the features of the computer system. Such computer programs represent controllers of the computer system. A computer program product comprises a tangible storage medium readable by a computer system and storing instructions for execution by the computer system for performing a method of one or more embodiments.

Though the embodiments have been described with reference to certain versions thereof; however, other versions are possible. Therefore, the spirit and scope of the appended claims should not be limited to the description of the preferred versions contained herein.

What is claimed is:

1. A programmable memory controller comprising:
a request hardware processor that comprises a first domain-specific instruction set architecture (ISA) to accelerate common requests;
a transaction hardware processor that comprises a second domain-specific ISA to accelerate transaction processing tasks and is configured to track information to generate a sequence of memory instructions that achieve performance energy and quality of service (QoS) goals; and
a dedicated command logic device configured to inspect each memory command to a memory device and to stall particular commands to meet timing constraints for application specific control of the memory device.

2. The memory controller of claim 1, wherein the transaction hardware processor is configured to generate a set of memory coordinates comprising at least channel, rank, bank, row and column identifications (IDs) for a requested address and to create a new transaction with the generated memory coordinates to enqueue in a transaction queue.

3. The memory controller of claim 2, wherein the memory coordinates are dynamic random access memory (DRAM) coordinates, and the memory device comprises at least one DRAM device.

4. The memory controller of claim 2, wherein the tracked information comprises at least resource needs and timing constraints for each memory transaction created by the request hardware processor.

5. The memory controller of claim 4, wherein the sequence of memory instructions are DRAM instructions.

6. The memory controller of claim 5, wherein a first subset of the DRAM instructions comprise transaction management instructions configured to categorize memory requests based on a state of the memory device, and to request type and application-specific criteria to derive a command schedule.

7. The memory controller of claim 6, wherein a second subset of the DRAM instructions comprise command management instructions configured to provide emission of a next required command for a given transaction or a new command for memory management purposes.

8. The memory controller of claim 7, wherein the command logic device is configured to stall commands at a head of a command queue to meet memory timing constraints and to synchronize issuance of each command.

9. The memory controller of claim 8, wherein the command logic device is configured to provide configurable control registers that specify values of each DDRx timing constraint, and timing correctness is separated from performance based on the request hardware processor and the transaction hardware processor configured to being dedicated to provide a performance-based schedule.

10. The memory controller of claim 1, wherein the first domain-specific ISA and the second domain-specific ISA are different from one another and each comprises customized instructions.

11. The memory controller of claim 10, wherein the request hardware processor is configured to provide specialized data types, storage structures and instructions to provide memory device address manipulation.

12. The memory controller of claim 11, wherein the specialized data types comprise an unsigned integer data type and a request data type.

13. The memory controller of claim 12, wherein an unsigned integer is 16 bits wide and is used for all instructions except jump instructions.

14. The memory controller of claim 12, wherein a request is 64 bits wide comprising a metadata field for information about a DRAM request.

15. The memory controller of claim 14, wherein the information about the DRAM request comprises type of memory operation, destination cache type, access initiation information, thread owner information, prefetch information and application specific priority information.

16. The memory controller of claim 15, wherein the transaction hardware processor is configured to provide data types comprising a transaction data type and a command data type.

17. The memory controller of claim 16, wherein a transaction comprises an address field, a fixed key field and a variable key field, and a command comprises an address field and a type field.

18. The memory controller of claim 17, wherein the variable key field comprises information for a state of a transaction based on timing constraints, resource availability and state of the memory device, and the variable key field includes a hardware managed section and a software managed section.

19. The memory controller of claim 1, wherein application-specific address mapping heuristics are used by the memory controller to improve performance and energy usage.

20. A system comprising:
one or more system processors;
a programmable memory controller coupled to the one or more system processors; and
a memory device coupled to the programmable memory controller; wherein the programmable memory controller comprises:
a programmable hardware request processor configured to use a first domain-specific instruction set architecture (ISA) to accelerate common requests;
a programmable transaction hardware processor configured to use a second domain-specific ISA to accelerate transaction processing tasks and to track information to generate a sequence of memory instructions that achieve performance energy and quality of service (QoS) goals; and
a dedicated command logic device configured to inspect each memory command to the memory device and to stall particular commands to meet timing constraints for application specific control of the memory device.

21. The system of claim 20, wherein the programmable transaction hardware processor is configured to generate a set of memory coordinates and to create a new transaction with the generated memory coordinates to enqueue in a transaction queue, and the programmable transaction hardware processor is configured to track information comprising at least resource needs and timing constraints for each memory transaction created by the programmable hardware request processor.

22. The system of claim 21, wherein a first subset of the memory instructions comprise transaction management instructions to categorize memory requests based on a state of the memory device, request type and application-specific criteria to derive a command schedule, and a second subset of the memory instructions comprise command management instructions to provide emission of a next required command for a given transaction or a new command for memory management purposes.

23. The system of claim 22, wherein the command logic device is configured to provide configurable control registers that specify values of each DDRx timing constraint, and timing correctness is separated from performance based on the programmable request hardware processor and the programmable transaction hardware processor being dedicated to provide a performance-based schedule.

24. The system of claim 20, wherein application-specific address mapping heuristics are used by the programmable memory controller to improve performance and energy usage.

25. The system of claim 20, wherein the system is deployed in one of a server device and a mobile computing device.

26. A non-transitory processor-readable medium that includes a program that when executed by a processor performs a method comprising:
   processing, by a request hardware processor, memory requests using a first domain-specific instruction set architecture (ISA) to accelerate memory requests;
   processing, by a transaction hardware processor, transactions using a second domain-specific ISA to accelerate transaction processing tasks;
   tracking, by the transaction hardware processor, information to generate a sequence of memory instructions that achieve performance energy and quality of service (QoS) goals; and
   inspecting, by a command logic device, each memory command directed to a memory device and stalling particular commands to meet timing constraints for application specific control of the memory device.

27. The non-transitory processor-readable medium of claim 26, wherein the method further comprising:
   generating, by the transaction hardware processor, a set of memory coordinates comprising channel, rank, bank, row and column identifications (IDs) for a requested address;
   creating, by the transaction hardware processor, a new transaction with the generated memory coordinates to enqueue in a transaction queue; and
   tracking, by the transaction hardware processor, information comprising at least resource needs and timing constraints for each created transaction.

28. The non-transitory processor-readable medium of claim 27, wherein the sequence of memory instructions are DRAM instructions.

29. The non-transitory processor-readable medium of claim 28, wherein the method further comprising:
   categorizing memory requests based on a state of the memory device, request type and application-specific criteria for deriving a command schedule.

30. The non-transitory processor-readable medium of claim 29, wherein the method further comprising:
   providing, by the command logic device, configurable control registers that specify values of each DDRx timing constraint, wherein timing correctness is separated from performance based on dedicated request processing and transaction processing to provide a performance-based schedule; and
   using application-specific address mapping heuristics to improve performance and energy usage of the memory device.

* * * * *